(12) United States Patent
Ichikawa

(10) Patent No.: US 8,549,717 B2
(45) Date of Patent: Oct. 8, 2013

(54) METHODS FOR MANUFACTURING PIEZOELECTRIC DEVICES

(75) Inventor: Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 116 days.

(21) Appl. No.: 13/214,074

(22) Filed: Aug. 19, 2011

(65) Prior Publication Data

US 2012/0049695 A1    Mar. 1, 2012

(30) Foreign Application Priority Data

Aug. 24, 2010 (JP) ................. 2010-186785

(51) Int. Cl.
*H04R 17/10* (2006.01)
*H01L 41/053* (2006.01)

(52) U.S. Cl.
USPC ............. 29/25.35; 29/846; 29/417; 310/344

(58) Field of Classification Search
USPC ......... 29/25.35, 830, 846, 417; 310/340, 342, 310/344; 438/28, 52, 53
See application file for complete search history.

(56) References Cited

U.S. PATENT DOCUMENTS 4,266,156 A * 5/1981 Kizaki ........................... 310/344
7,279,824 B2 * 10/2007 Tanaya et al. ................. 310/344

FOREIGN PATENT DOCUMENTS

JP    2005-026974         1/2005
JP    2008035181 A  *   2/2008

OTHER PUBLICATIONS

Machine Language Translation (English) of Japanese Patent Publication JP 2005-26974, Jun. 2005.*

* cited by examiner

*Primary Examiner* — A. Dexter Tugbang
(74) *Attorney, Agent, or Firm* — Klarquist Sparkman, LLP

(57) ABSTRACT

Methods are provided for manufacturing piezoelectric vibrating devices that do not contain any unwanted gas or water vapor inside the devices. In an exemplary method, a base wafer is prepared including multiple package bases each having a first main surface and a second main surface. The base wafer also includes a pair of through-holes disposed between adjacent package bases of the base wafer. A piezoelectric vibrating piece is placed on each package base. A lid wafer is prepared that includes multiple package lids. A sealing material is applied to the base wafer or lid wafer in peripheral bands used for bonding the bases and lids together and defines respective interior cavities. The band of sealing material includes a communicating groove that communicates from the inner cavity to the first through-hole. The base wafer and lid wafer are subject to heat and compression to effect bonding. Meanwhile, the cavities are allowed to ventilate through the communicating grooves and through-holes to ensure that the cavities have a desired vacuum level or inert gas contents before completion of sealing.

11 Claims, 15 Drawing Sheets

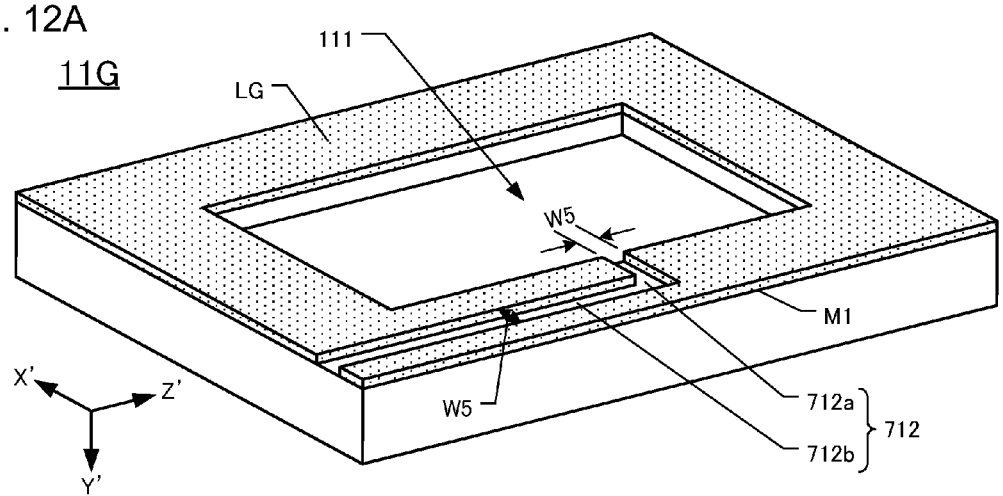
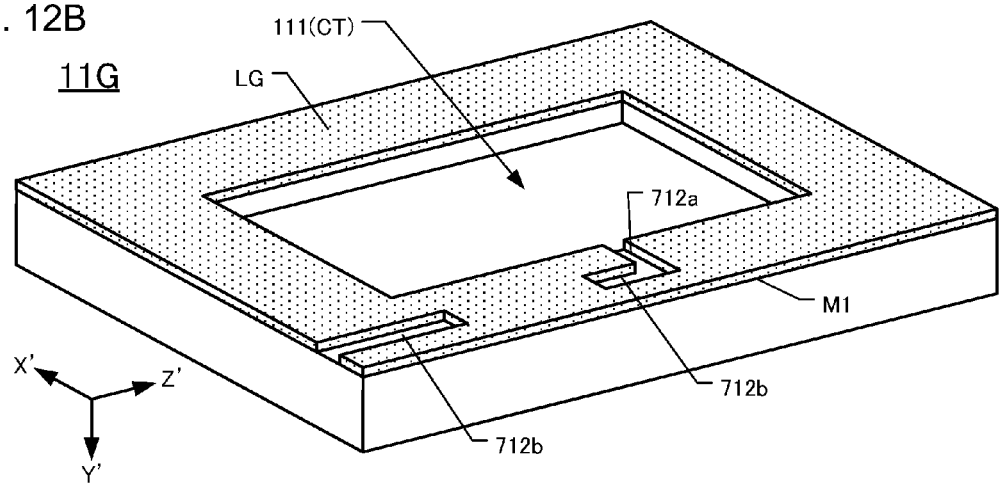
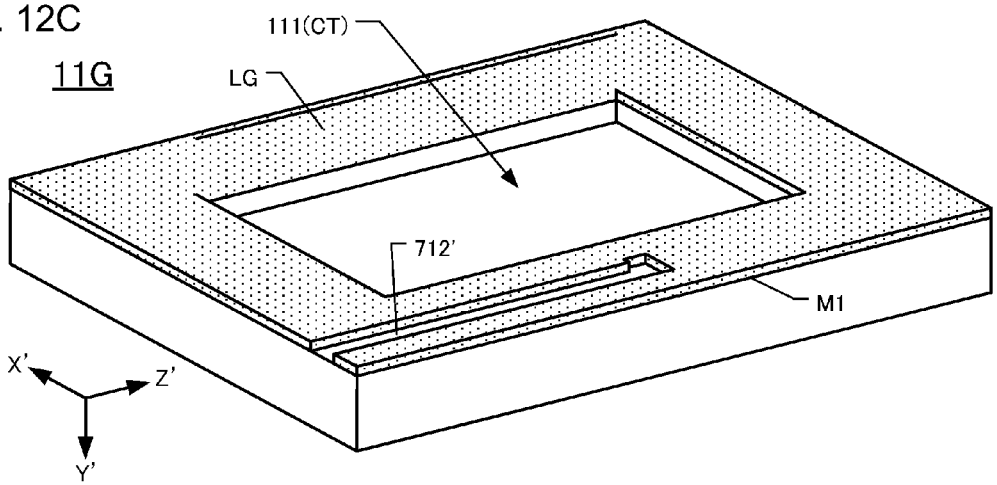

METHODS FOR MANUFACTURING PIEZOELECTRIC DEVICES

CROSS-REFERENCE TO RELATED APPLICATION

This application claims priority to and the benefit of Japan Patent Application No. 2010-186785, filed on Aug. 24, 2010, in the Japan Patent Office, the disclosure of which is incorporated herein by reference in its entirety.

FIELD

This disclosure pertains to, inter alia, piezoelectric vibrating devices that, during their manufacture, automatically ventilate unwanted gas from inside their respective packages before the packages are hermetically sealed, and to methods for manufacturing such devices.

TECHNICAL BACKGROUND

A surface-mount type piezoelectric device is one in which a piezoelectric vibrating piece is mounted on an insulating package base made of a material such as alumina ceramic. A package lid is then sealed to the package base to enclose the piezoelectric vibrating piece. During manufacture of such a piezoelectric device, a layer of sealing material, such as a polymeric resin or low-melting-point glass (LMPG), is formed on a sealing surface formed either on the package base or on the package lid. Using resin for forming a sealing layer can cause problems, such as parametric fluctuations, because polymeric resins tend to release gas under the elevated temperatures required for curing the resin. Even if the sealing layer is formed of LMPG, entrapped bubbles in the LMPG can release gas, causing adverse effects to the piezoelectric vibrating piece inside the package.

Japan Patent Publication No. JP 2005-026974A discloses a method for releasing unwanted gas from inside the package. On the entire edge-surface of the package base made of a non-conductive material, a first layer of LMPG is applied for temporary hardening. Then, a layer of a second LMPG is applied over the first layer and temporarily hardened. The second LMPG is not applied to pre-designated regions of the surface of the second LMPG, particularly regions connected to inside the package. These regions provide escape routes for release of gas from the package before completion of package sealing.

The method disclosed in JP '974 disadvantageously requires two or more applications of LMPG and respective temporary hardening steps, which is process-intensive. Also, if the second LMPG has low viscosity, then the second LMPG tends to spread, before it has temporarily hardened, to regions where LMPG is not wanted. Replacing the low-viscosity LMPG with a higher-viscosity LMPG poses difficulties in sealing, due to the problem of the LMPG not flowing to surrounding regions. Furthermore, the manufacturing methods discussed in JP '974 require applying LMPG on each individual piezoelectric device, which is unsuitable for mass-production.

Therefore, there is a need for methods for manufacturing piezoelectric devices, as disclosed herein, that do not result in entrapment of unwanted gas or water vapor inside the package containing the piezoelectric device. There is also a need for piezoelectric vibrating devices that do not contain unwanted gas or water vapor.

SUMMARY

A first aspect of the invention is directed to methods for manufacturing a piezoelectric device. An exemplary embodiment of such a method comprises preparing a base wafer including multiple package bases each having a first main surface including respective external electrodes and a second main surface opposite the first main surface. The second main surface includes a respective peripheral sealing main surface. The base wafer also defines at least a pair of respective through-holes located between adjacent package bases, wherein each through-hole extends from the first main surface to the second main surface. Each package base when assembled with a package lid forms a respective package defining an interior cavity. A respective piezoelectric vibrating piece is attached to each package base. Each vibrating piece includes a respective pair of excitation electrodes. A lid wafer is prepared that includes multiple package lids. Each package lid has a first main surface and a second main surface opposite the first main surface. The second main surface includes a respective peripheral sealing surface. A sealing material is applied onto the peripheral sealing surfaces of the package bases or onto the peripheral sealing surfaces of the package lids. The sealing material is applied as a continuous band having a predetermined width and including a "communicating groove" allowing temporary pneumatic communication to and from the interior cavity via the through-hole. In a vacuum or inert-gas atmosphere, gaseous exchange is made to and from the cavities via the respective communicating grooves and through-holes while applying heat and compression. The heat and compression bonds the wafers together while allowing flow of sealing material into at least a portion of the communicating grooves sufficient to seal the cavities after the gaseous exchange.

The method can further comprise forming a metal film on respective interior surfaces of the through-holes, wherein the metal film connects together each excitation electrode with a respective external electrode.

The sealing material desirably is an adhesive comprising a glass that melts between 350° C. to 410° C. This material is termed "low-melting-point glass."

After bonding the wafers together, the bonded wafers desirably are cut along pre-established scribe lines to release and separate the individual piezoelectric vibrating devices. The scribe lines are located so as to allow cutting across respective communicating grooves.

In some embodiments the communicating grooves expand in width from the respective interior cavities to the scribe lines. Each communicating groove can have at least a portion having a width that is in a range of 10% to 30% of the width of the band of sealing material.

The package base in some embodiments has a rectangular plan profile. A respective through-hole can be located on each corner of the rectangular profile. The interior cavity also has a rectangular shape with opposing short sides and opposing long sides. In these and other embodiments each communicating groove can extend from a respective long side of the rectangular cavity to the through-hole.

In other embodiments in which the package base has a rectangular plan profile with opposing short sides and opposing long sides, a respective through-hole can be located between adjacent short sides. The interior cavity also has a rectangular shape, wherein each communicating groove extends from a respective long side of the rectangular cavity to the through-hole.

In another method embodiment a base wafer is prepared including multiple package bases each having a first main surface including respective external electrodes and a second main surface opposite the first main surface. The second main surface includes a respective peripheral sealing surface. The base wafer also defines at least a pair of first respective through-holes located between adjacent package bases, wherein each first through-hole extends from the first main surface to the second main surface. Each package base when assembled with a piezoelectric frame and package lid forms a respective package defining an interior cavity. Also prepared is a piezoelectric wafer that includes multiple piezoelectric frames. Each piezoelectric frame includes a respective piezoelectric vibrating piece attached to and surrounded by an outer frame. Each vibrating piece has respective excitation electrodes, a first peripheral sealing surface, and a second peripheral sealing surface. The piezoelectric wafer defines at least a pair of respective second through-holes located between adjacent outer frames, wherein each second through-hole extends from the first peripheral sealing surface to the second peripheral sealing surface. Also prepared is a lid wafer that includes multiple package lids each having an outer main surface and an inner main surface. The inner main surface includes a peripheral sealing surface. The method also comprises applying a sealing material on at least one of the peripheral sealing surface of the inner main surface of each lid and the first peripheral sealing surface of each outer frame, and on at least one of the second peripheral sealing surface of each outer frame and the peripheral sealing surface of the second main surface of each base. The sealing material is applied as a continuous band having a predetermined width, and includes a communicating groove allowing temporary communication to and from the interior cavity via the first through-holes or second through-holes. In a vacuum or inert-gas atmosphere, gaseous exchange to and from the cavities is allowed to occur via the communicating groove and respective through-holes during application of heat and compression. The heat and compression bond the wafers together while allowing flow of sealing material into at least a portion of the communicating grooves sufficient to seal the cavities after the gaseous exchange.

According to another aspect, piezoelectric devices are provided. An exemplary embodiment of such a device comprises a package base including an inner main surface and an outer main surface, wherein the outer main surface includes external electrodes and the inner main surface comprises a peripheral bonding region. A respective edge-surface electrode is connected to each external electrode, and each edge-surface electrode is located on an outer edge of the package base and extends on the outer edge in the thickness dimension between the inner and outer main surfaces. The device also comprises a piezoelectric vibrating piece supported by the package base. The vibrating piece includes a respective excitation electrode connected to each edge-surface electrode. A package lid is bonded to the package base to form an interior cavity enclosing the piezoelectric vibrating piece. The package lid includes an inner main surface and an outer main surface, wherein the inner main surface comprises a peripheral bonding region. A sealing material is disposed as a band on the respective peripheral bonding regions of the package base and package lid to bond the package base and lid together. The bands of sealing material have a predetermined width in the peripheral bonding regions and define at least one communicating groove extending therein between the interior cavity and at least one of the first edge-surface electrodes. The communicating groove is at least partially filled with the sealing material to seal the interior cavity hermetically.

In some embodiments the outer frame and package base each have a respective rectangular plan profile including a respective castellation on each corner thereof. In these embodiments the second edge-surface electrodes can be formed on respective corner castellations. In other embodiments in which the outer frame and package base each have a respective rectangular plan profile, the devices can include a respective castellation on each of two sides, wherein the second edge-surface electrodes are formed on respective edge castellations.

According to another embodiment, a piezoelectric device comprises a package base including an inner main surface and an outer main surface, wherein the outer main surface includes external electrodes and the inner main surface comprises a peripheral bonding region. A respective first edge-surface electrode is connected to each external electrode. Each first edge-surface electrode is located on an outer edge of the package base and extends on the outer edge in the thickness dimension between the inner and outer main surfaces. The devices include a piezoelectric frame including a piezoelectric vibrating piece surrounded by an outer frame. The vibrating piece has first and second main surfaces each including a respective peripheral bonding region. The peripheral bonding region of the first main surface is bonded to the peripheral bonding region of the package base. The devices also include a respective second edge-surface electrode connected to each excitation electrode, wherein each second edge-surface electrode is located on an outer edge of the outer frame and extends on the outer edge in the thickness dimension between the first and second main surfaces of the outer frame. Each device also includes a package lid including an inner main surface and an outer main surface. The inner main surface includes a peripheral bonding region that is bonded to the peripheral bonding region of the second main surface of the frame to form an interior cavity enclosing the piezoelectric vibrating piece. A first sealing material is disposed as a band having a predetermined width between the peripheral bonding region of the package lid and the peripheral bonding region of the second main surface of the outer frame. A second sealing material (which can be the same as the first sealing material, or different) is disposed as a band at a predetermined width between the peripheral bonding region of the package base and the peripheral bonding region of the first main surface of the outer frame so as to bond the package lid, piezoelectric frame, and package base together. The bands of sealing material have predetermined widths in the respective peripheral bonding regions and define at least one communicating groove extending therein between the interior cavity and at least one of the first edge-surface electrodes. The communicating groove is at least partially filled with the sealing material to seal the interior cavity hermetically.

In some embodiments the outer frame and package base each have a respective rectangular plan profile including a respective castellation on each of two sides thereof. In these embodiments the second edge-surface electrodes can be formed on respective edge castellations.

According to the foregoing summary, piezoelectric devices and associated manufacturing methods are provided. The devices do not contain any unwanted gas or water vapor in their interior cavities. The subject methods are readily applied to mass-production of the devices. Also, the various embodiments of piezoelectric devices oscillate or vibrate at a specified frequency, as a result of eliminating unwanted gas or water vapor.

BRIEF DESCRIPTION OF THE DRAWINGS

FIG. 12A is a perspective, upside-down view of a package lid of the seventh embodiment, after applying a sealing material.

FIG. 12B is another perspective, upside-down view of a package lid of the seventh embodiment, showing a manner in which the communicating groove is filled at least partially by sealing material during bonding.

FIG. 12C is another perspective, upside-down view of a package lid of the seventh embodiment, showing a manner in which the communicating groove is filled at least partially by sealing material during bonding.

DETAILED DESCRIPTION

Various embodiments are described in detail below, with reference to the accompanying drawings.

In the described embodiments, an AT-cut quartz-crystal vibrating piece is used as an exemplary piezoelectric vibrating piece. An AT-cut quartz-crystal vibrating piece has a principal surface (in the YZ plane) that is tilted by 35° 15' about the Y-axis of the crystal coordinate system (XYZ) in the direction of the Y-axis from the Z-axis around the X-axis. Thus, in the following description, new axes tilted with respect to the axial directions of the quartz-crystal vibrating piece are denoted as the X'-axis, Y'-axis, and Z'-axis, respectively. Regarding a height in the Y'-axis direction, a positive (+) direction is denoted as high and a negative (−) direction is denoted as low.

First Embodiment of Quartz-Crystal Vibrating Device

Figure 1:
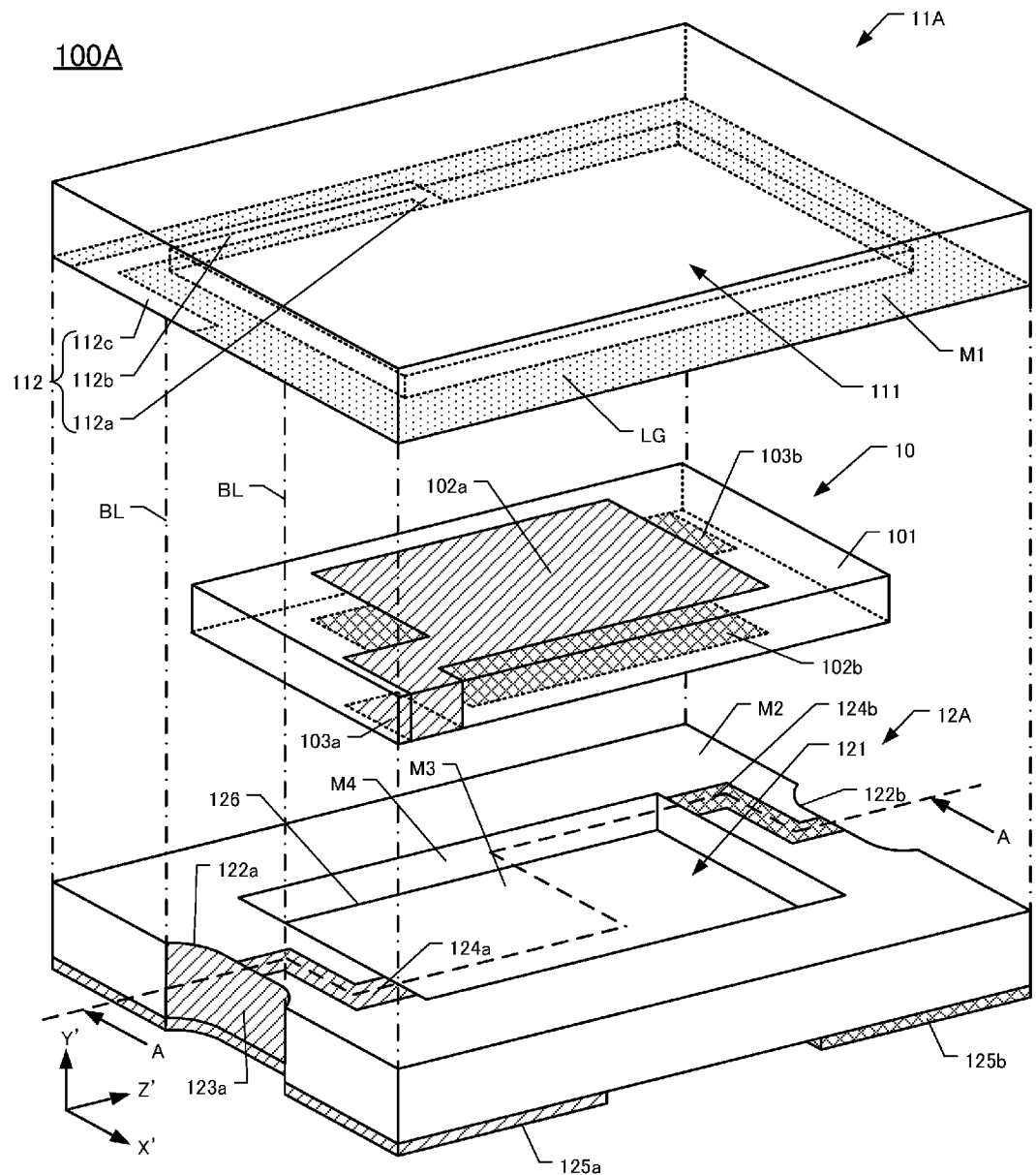
FIG. 1 is an exploded perspective view of a quartz-crystal vibrating device according to the first embodiment, before the package base and package lid have been bonded together.
Figure 2:
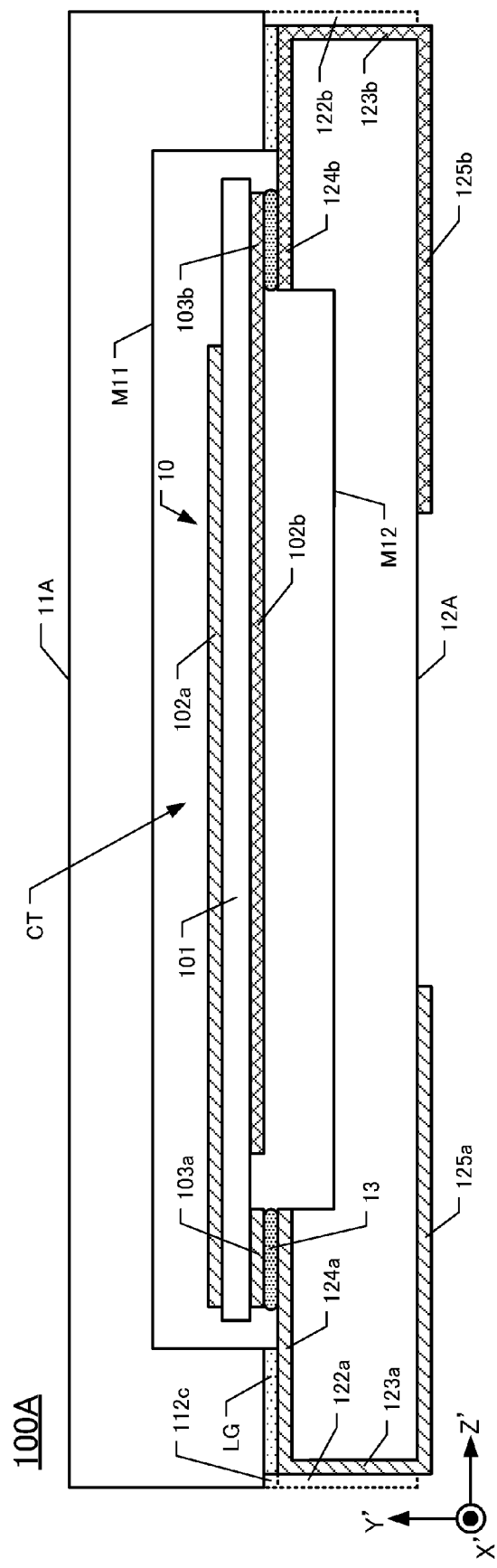
FIG. 2 is an elevational cross-section, along the line A-A in FIG. 1, after bonding the package lid to the package base.
Figure 3A:
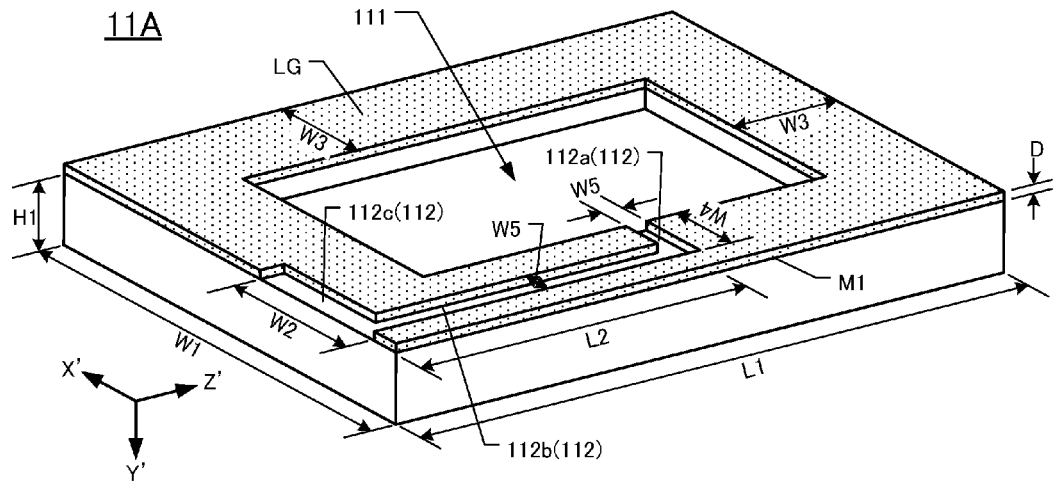
FIG. 3A is a perspective, upside-down view of the package lid of the first embodiment, before bonding it to the package base.
Figure 3B:
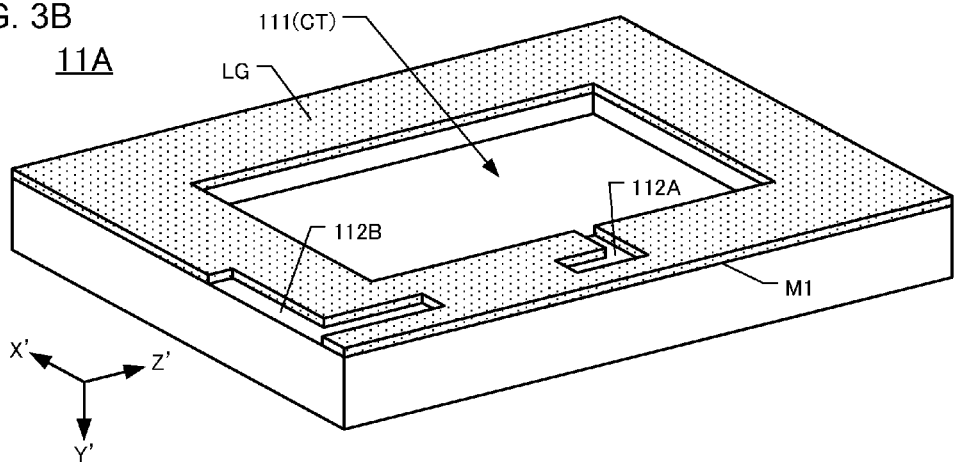
FIG. 3B is a perspective, upside-down view of the package lid of the first embodiment, showing one manner in which a communicating groove is filled during compression performed during bonding.
Figure 3C:
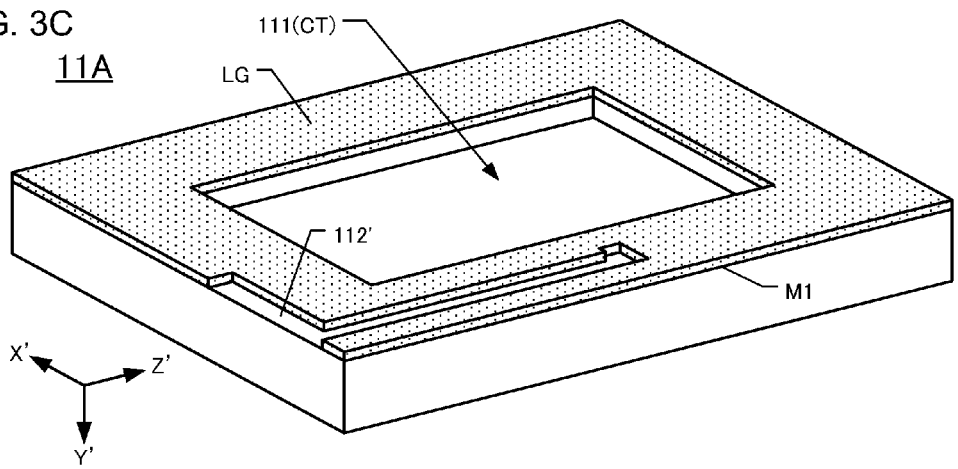
FIG. 3C is a perspective, upside-down view of the package lid of the first embodiment, showing another manner in which a communicating groove is at least partially filled by sealing material during bonding.

The overall configuration of this embodiment of a quartz-crystal vibrating device 100A is described with reference to FIGS. 1, 2, and 3A-3C. FIG. 1 is an exploded perspective view of a quartz-crystal vibrating device 100 of this embodiment before the package base and lid have been bonded together. FIG. 2 is an elevational section, along the line A-A in FIG. 1, after stacking the package lid 11A on the package base 12A. FIG. 3A is a perspective, upside-down view of the package lid 11A before it is bonded to the package base 12A. FIGS. 3B and 3C are similar perspective views of the package lid 11A after it is bonded to the package base 12A.

In this specification, a situation in which the package base and package lid have been placed in vertical alignment with each other without being compressed together is referred to as "stacked," and a situation in which the package base and package lid have been compressed together with sealing material (and thus bonded together) is referred to as "bonded."

The first embodiment of a quartz-crystal vibrating device 100A shown in FIG. 1 includes a package lid 11A that defines a lid recess 111. The device also includes a package base 12A that defines a base recess 121. A quartz-crystal vibrating piece 10 is mounted onto the base recess 121. The lid recess 111 and base recess 121 are formed by sand-blasting or wet-etching. For example, whenever the base recess 121 is formed by sand-blasting, the conjunction 126 of the bottom surface M3 and the side surface M4 of the base recess 121 is sharp, substantially without any corner radius. However, whenever the base recess 121 is formed by etching, the conjunction 126 has a significant corner radius. In this specification, the conjunctions are indicated as being sharp.

The quartz-crystal vibrating piece 10 comprises the quartz-crystal piece 10. A respective excitation electrode 102a, 102b is disposed substantially centrally on each main surface of the quartz-crystal piece 19, wherein the main surfaces face each other across the thickness dimension of the quartz-crystal piece 10. A respective excitation electrode 102a is connected to the extraction electrode 103a and extends toward the −Z'-axis corner of the quartz-crystal piece 101 on the +X'-axis side. Similarly, a respective excitation electrode 102b is connected to the extraction electrode 103a and extends toward the +Z'-axis corner of the quartz-crystal piece 101 on the −X'-axis side. The quartz-crystal vibrating piece 10 is bonded to the package base 12A, which is fabricated from a piezoelectric body such as glass or quartz-crystal. Bonding is performed using electrically conductive adhesive 13 (FIG. 2).

The package base 12A comprises a peripheral sealing surface M2 on the upward-facing main surface (+Y'-side surface) surrounding the base recess 121. On the package base 12A are respective base castellations 122a, 122b on the −Z'-axis edge and on the +Z'-axis edge. On the lower main surface of the package base 12A are external electrodes 125a, 125b formed in the +Z'-axis region and in the −Z'-axis region. The lower main surface is termed the vibrating device mounting surface. In each base castellation 122a, 122b is a respective base-edge electrode 123a, 123b connected to the respective external electrode 125a, 125b. Thus, the base-edge electrodes 123a, 123b connect the respective base castellations 122a, 122b to the respective external electrodes 125a, 125b. Also, connecting electrodes 124a, 124b on the peripheral sealing surface M2 of the package base 12A and are also connected to the respective base edge-surface electrodes 123a, 123b.

Turning to FIG. 2, an electrically conductive adhesive 13 is applied onto each connecting electrode 124a, 124b. The electrically conductive adhesive 13 connects the extraction electrodes 103a, 103a on the quartz-crystal vibrating piece 10 to the respective connecting electrodes 124a, 124b. Thus, the quartz-crystal vibrating piece 10 is mounted onto the peripheral sealing surface M2 of the package base 12A, which achieves connection of the excitation electrodes 102a, 102b on the quartz-crystal vibrating piece 10 to the respective external electrodes 125a via the respective extraction electrodes 103a, 103b, and achieves connection of the electrodes 124a, 124b to the respective base-edge electrodes 123a, 123b. Whenever an alternating voltage (voltage that alternates between positive and negative values of a selected voltage) is applied across the external electrodes 125a, 125b, the quartz-crystal vibrating device 10 exhibits thickness-shear vibration.

This embodiment of a quartz-crystal vibrating device 100A also comprises a package lid 11A, which is bonded to the peripheral sealing surface M2 on the package base 12A using a sealing material such as low-melting-point glass LG. Bonding the package lid 11A to the package base 12A forms an interior cavity CT in which the quartz-crystal vibrating piece 10 is mounted. The cavity CT is filled with an inert gas or is evacuated.

The low-melting-point glass LG is a lead-free, vanadium-based glass having an adhesive component that melts at 350° C. to 400° C. Vanadium-based glass can be formulated as a paste mixed with binder and solvent, and bonds to various materials by melting and solidifying. The melting point of vanadium-based glass is lower than the melting point of the package lid 11A or the melting point of the package base 12A since the package lid and base are fabricated of piezoelectric material or glass. Vanadium-based glass forms a highly reliable air-tight seal and resists water and humidity. Low-melting-point glass (LMP glass) forms a highly reliable air-tight seal and resists water and humidity from entering into the cavity CT. Since the coefficient of thermal expansion of LMP glass can be controlled effectively by controlling its glass structure, LMP glass can be bonded to various materials having different respective coefficients of thermal expansion, such as ceramics, glass, semiconductor material, and metal.

In FIG. 3A, the lid recess 111 is drawn upside-down (facing upward), to provide clarity. The package lid 11A is cubic-shaped, with an exemplary length L1 in the Z'-axis direction of approximately 3,200 µm, an exemplary width W1 in the X'-axis direction of approximately 2,500 µm, and an exemplary height H1 in the Y'-axis direction of approximately 180 µm. Although not shown, the package base 12A can have the same dimensions as the package lid 11A.

The package lid 11A has a peripheral sealing M1 surrounding the lid recess 111. The peripheral sealing surface M1 is bonded to the peripheral sealing surface M2 of the package base 12A. The width W3 of the peripheral sealing surface M1 is approximately 400 µm. On the peripheral sealing M1 of the package lid 11A, a layer of low-melting-point glass LG is applied; this layer has a thickness D of 10 µm to 15 µm.

As the low-melting-point glass LG is applied to the peripheral sealing surface M1 of the package lid 11A, a "communication groove" 112 is also formed. The communication groove 112 includes a first groove portion 112a, a second groove portion 112b, and a third groove portion 112c. One end of the first groove portion 112a (extending in the +X'-axis direction) opens into the lid recess 111, and the other end (extending in the −X'-axis direction) is connected to the second groove portion 112b (extending in the +Z'-axis direction). One end of the third groove portion 112c (extending in the −X'-axis direction) is connected to the second end of the second groove portion 112b. The second end of the third groove portion 112c extends toward the base castellation 122a so as to communicate with the base castellation whenever the package lid 11A and package base 12A are stacked together (see FIGS. 1 and 2).

The width W5 of each of the first groove portion 112a, the second groove portion 112b, and the third groove portion 112c is in the range of 10% to 30% of the width W3 of the peripheral sealing M1. I.e., the width W5 is in the range of 40 µm to 120 µm. In the first embodiment, further details are described below under the assumption that W5=100 µm.

The length W4 of the first groove portion 112a in the X'-axis direction is approximately 300 µm. Therefore, on the second groove portion 112b (wherein W5=100 µm) the low-melting-point glass LG is applied on the +X'-axis side at a width of 200 µm, and on the −X'-axis side at a width of 100 µm. Since the first groove portion 112a is situated at substantially the center-line of the lid recess 111 in the Z'-axis direction, the length L2 of the second groove portion 112b in the Z'-axis direction is approximately 1,600 µm. The length W2 of the third groove portion 112c in the X'-axis direction is in the range of 800 µm to 1,000 µm.

As indicated by the lines BL in FIG. 1, whenever the package lid 11A and package base 12A are stacked together, the third groove portion 112c extends toward the base castellation 122a. Also, as shown in FIG. 2, whenever the package base 12A and package lid 11A are stacked together, the third groove portion 112c is disposed on top of the base castellation 122a.

Consequently, whenever the package base 12A and package lid 11A are stacked together prior to bonding, the cavity CT is in communication with the exterior environment via the base castellation 122a and the communicating groove 112. Hence, whenever the stacked-together package base 12A and package lid 11A is placed inside a vacuum reflow chamber, gas formed between particles of the low-melting-glass is released to the environment outside the cavity CT. Also, whenever the package base 12A and package lid 11A, as stacked together, are placed inside a chamber filled with an inert gas, the inert gas flows via the communicating groove 112 to inside the cavity CT.

After these gaseous exchanges through the communicating groove 112 are completed, the package base 12A and package lid 11A are bonded together by continued heating of the low-melting-point glass LG and compressing the package lid 11A and package base 12A together. During this compression, low-melting-point glass LG situated in the adjacent communicating groove 112 migrates into the communicating groove 112 and seals it, leaving the cavity CT with the desired vacuum or inert gas inside.

There are various ways in which to seal the communicating groove 112, depending upon the manner in which the package lid and base are compressed together. In FIG. 3B, some of the low-melting-point glass LG in the vicinity of the second groove portion 112b is pressed, thereby hermetically sealing the communicating groove 112. In this instance, even if the package base 12A and package lid 11A are bonded together, the groove portion 112A connected to the cavity CT and the groove portion 112B connected to the base castellation 122a remain, indicating the residual presence of the communicating groove 112.

In FIG. 3C, some of the low-melting-point glass LG in the vicinity of the first groove portion 112a is compressed, thereby hermetically sealing the communicating groove 112. In this instance, even if the package base 12A and package lid 11A are bonded together, the groove portion 112' remains, indicating the residual presence of the communicating groove 112. Although not shown in the drawings, the two regions of low-melting-point glass LG indicated in FIGS. 3B and 3C may be filled at the same time. Also, the first groove portion 112a and second groove portion 112b may be compressed entirely together, which would eliminate all the groove portions.

In FIGS. 3B and 3C, regions of low-melting-point glass LG around the third groove portion 112c are not likely to be compressed. Due to the presence of the base castellation 122a, the low-melting-point glass LG applied near the third groove portion unit 112c is not likely to be affected by pressure even when the package lid 11A and package base 12A are compressed together. Also, even when strong compression is applied to the low-melting-point glass LG, it tends merely to flow into the base castellation 122a rather than seal the communicating groove 112.

In the first embodiment, the low-melting-point glass LG is applied in a peripheral zone around the package lid 11A. Alternatively, the low-melting-point glass can be applied to the peripheral sealing surface 112 formed on the package base 12A instead of to the package lid 11A. Alternatively, the low-melting-point glass can be applied to the peripheral surfaces on both the package lid 11A and the package base 12A.

Method for Manufacturing First Embodiment of Quartz-Crystal Vibrating Device

Figure 4:
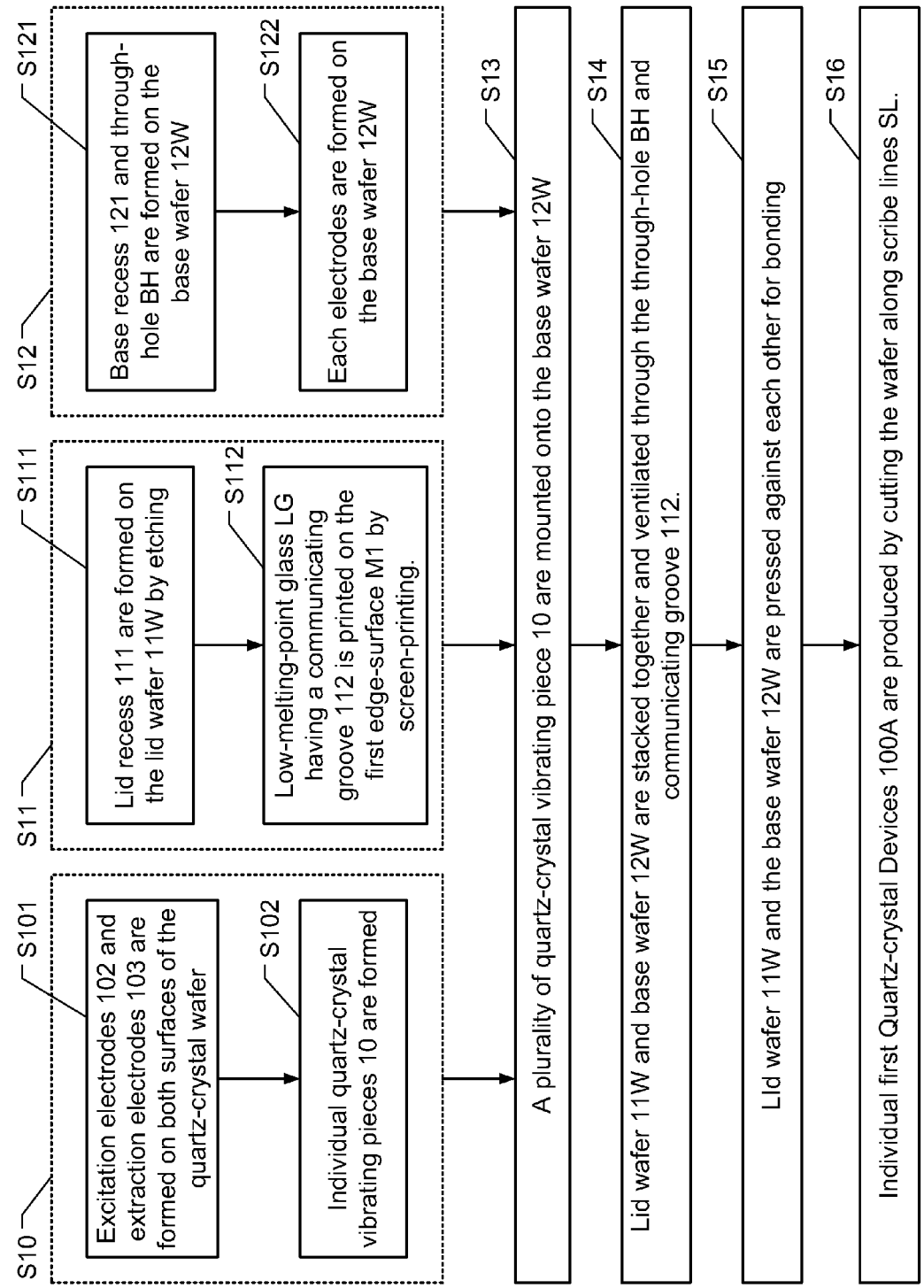
FIG. 4 is a flow-chart of protocols and steps in an embodiment of a method for manufacturing a quartz-crystal vibrating device according to the first embodiment.
Figure 5:
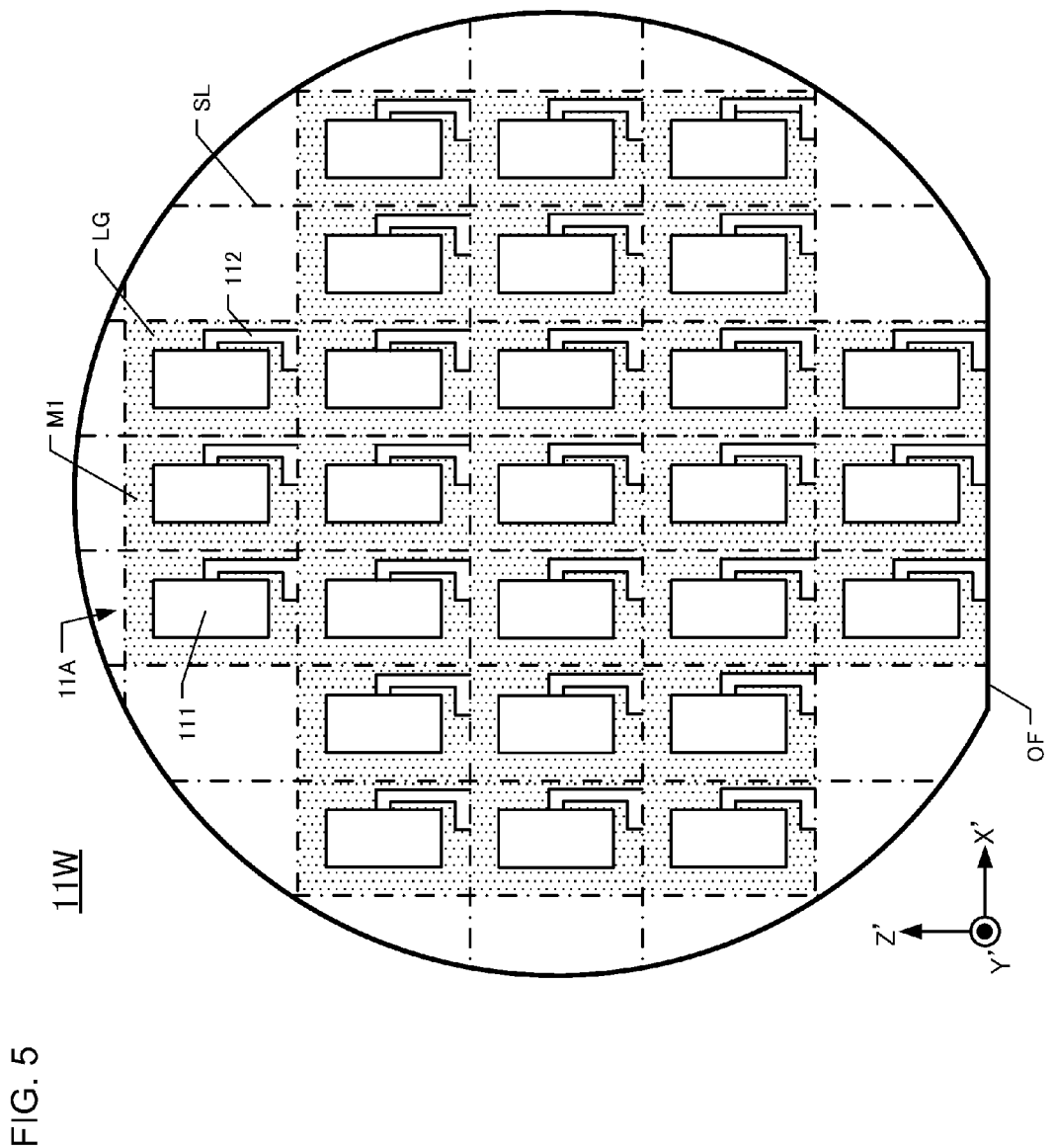
FIG. 5 is a plan view of a lid wafer of the first embodiment, before bonding.
Figure 6:
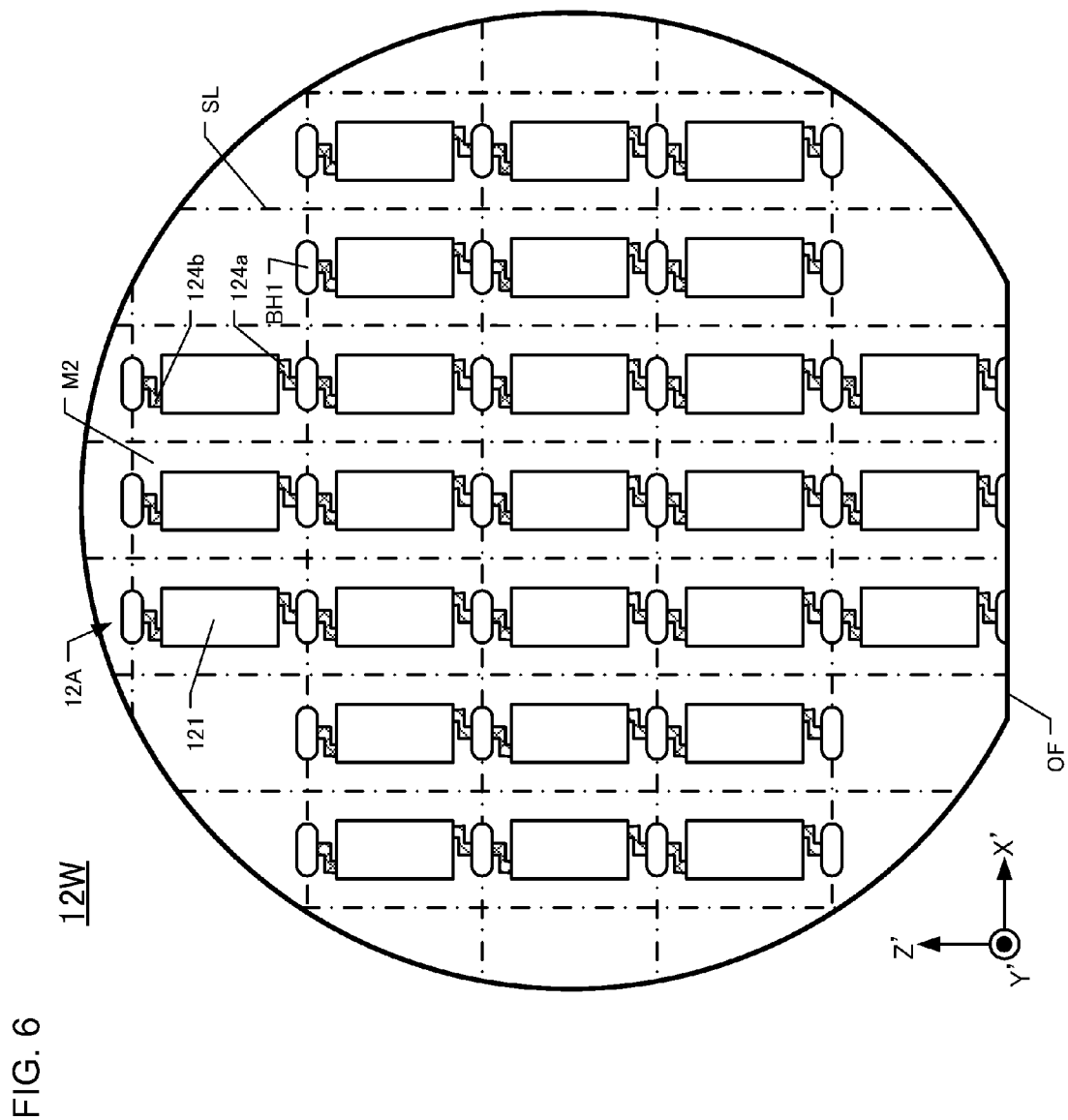
FIG. 6 is a plan view of a base wafer of the first embodiment, before bonding.

FIG. 4 is a flow-chart showing an embodiment of a method for manufacturing the first embodiment of a quartz-crystal vibrating device 100A. In FIG. 4, the protocol S10 is directed to manufacture of the quartz-crystal vibrating piece 10, the protocol S11 is directed to manufacturing the package lid 11A, and the protocol S12 is directed to manufacturing the package base 12A. These protocols can be performed separately or in parallel. FIG. 5 is a plan view of the lid wafer 11W used in this embodiment. FIG. 6 is a plan view of the base wafer 12W used in this embodiment.

In protocol S10, the quartz-crystal vibrating piece 10 is manufactured. Protocol S10 comprises steps S101 and S102. In step S101, a layer of chromium (Cr) is formed, followed by formation of an overlying layer of gold (Au), on both main surfaces of a quartz-crystal wafer (not shown) by sputtering or vacuum-deposition. Then, a photoresist is applied uniformly over the surface of the metal layer. Using an exposure tool (not shown), the profile outlines of the quartz-crystal vibrating pieces 10 are lithographically exposed onto the main surfaces of the quartz-crystal wafer.

After removing unneeded regions of the gold and chromium layers, second layers of chromium (Cr) and gold (Au) are formed. Then, a photoresist is applied uniformly on both surfaces of the quartz-crystal wafer. Using an exposure tool (not shown), the profile outlines of the quartz-crystal vibrating pieces 10 are lithographically exposed onto both surfaces of the quartz-crystal wafer. Unneeded regions of the gold layer and chromium layer are removed again, and third layers of chromium (Cr) and gold (Au) are formed. Then, a photoresist is applied uniformly on both main surfaces of the quartz-crystal wafer to form the patterns of electrodes on both main surfaces of the quartz-crystal wafer. Then, the gold and chromium layers are etched to form the excitation electrodes 102a, 102b and extraction electrodes 103a, 103b on the quartz-crystal wafer.

In step S102, individual quartz-crystal vibrating pieces 10 are cut from the quartz-crystal wafer to form multiple separate pieces each having excitation electrodes 102a, 102b and extraction electrodes 103a, 103b.

In protocol S11, the package lid 11A is manufactured. Protocol S11 comprises steps S111 and S112. In step S111, as shown in FIG. 5, several hundreds to several thousands of lid recesses 111 are formed on the lid wafer 11W, which is a circular, uniformly planar plate of quartz-crystal material. On the lid wafer 11W, lid recesses 111 are formed by etching or mechanical processing. Each lid recess 111 is surrounded by a respective peripheral sealing surface M1.

In step S112, as shown in FIG. 5, a low-melting-point glass LG is printed on the peripheral sealing surfaces M1 on the lid wafer 11W by screen-printing. The low-melting-point glass LG is applied in a manner that also forms the communicating groove 112 that provides communication of the lid recess 111 to the external environment (ventilated via the base through-hole BH1 in FIG. 6). Then, the low-melting-point glass LG on the peripheral sealing surfaces M1 is preliminarily cured.

In protocol S12, package bases 12A are manufactured, Protocol S12 comprises steps S121 and S122. In step S121, as shown in FIG. 6, several hundreds to several thousands of base recesses 121 are formed on a base wafer 12W, which is a circular, uniformly planar plate of quartz-crystal material. On the base wafer 12W, the base recesses 121 are formed by etching or mechanical processing. Each base recess 121 is surrounded by a peripheral sealing surface M2. Respective rounded-rectangular through-holes BH1 are also formed (between longitudinal sides of adjacent package bases) on the package base 12A in the Z'-axis directions. The through-holes extend depthwise through the thickness of the base wafer 12W. Later, when the base through-holes BH1 are cut through in half, they form respective base castellations 122a, 122b (refer to FIG. 1).

In step S122, a layer of chromium (Cr) is formed, followed by formation of an overlying layer of gold (Au), on both main surfaces of the base wafer 12W by sputtering or vacuum-deposition. After selected regions in this metal bilayer are etched, connecting electrodes 124a, 124b are formed on peripheral sealing surfaces M2, as shown in FIG. 6. At the same time, the external electrodes 125a, 125b are formed on the base wafer 12W, and the base edge-surface electrodes 123a, 123b are formed on the inner surfaces of the base through-holes BH1 (refer to FIG. 1).

In step S13, the quartz-crystal vibrating pieces 10, manufactured in protocol S10, are mounted onto the peripheral sealing surfaces M2 on the package bases 12A using electrically conductive adhesive 13. Here, the quartz-crystal vibrating piece 10 is mounted onto the peripheral sealing surface M2 of the package base 12A (FIG. 2), so as to align the extraction electrodes 103a, 103b on the quartz-crystal vibrating pieces 10 with respective connecting electrodes 124a, 124b formed on the peripheral sealing surface M2 of the package bases 12A.

In step S14, the lid wafer 11W and base wafer 12W are stacked together by co-aligning them. The lid wafer 11W in FIG. 5 includes a respective orientation flat OF formed on an outer edge thereof, and the base wafer 12W includes a respective orientation flat OF formed on an outer edge thereof. Using the orientation flats OF as alignment references, the lid wafer 11W and the base wafer 12W are precisely aligned together when the wafers are stacked. When stacked, the lid recesses 111 and base recesses 121 form respective cavities CT. Each cavity CT communicates to the external environment via respective base through-holes BH1 and communicating grooves 112. As a stack, the wafers are heated in an evacuated chamber or in a chamber filled with inert gas, at a temperature in the range of 350° C. to 400° C. The wafers must be adequately heated. Placing wafers inside the chamber that are not well-heated initially prevents the low-melting-point glass LG from reaching its melting point. If the wafers are placed in a vacuum-reflow chamber, the gas inside the cavity CT is ventilated via the communicating groove 112 to the external environment in the chamber. Alternatively, if placed in a chamber filled with inert gas, the inert gas may enter the cavities CT via the communicating groove 112.

In step S15, the lid wafer 11W and the base wafer 12W are compressed against each other to bond the lid wafer 11W to the base wafer 12W. When the wafers are placed inside a vacuum-reflow chamber or a chamber filled with an inert gas, the low-melting-point glass LG is heated to a temperature in the range of 350° C. to 400° C., in which the low-melting-point glass LG reaches its the melting temperature. At this point, whenever the lid wafer 11W and base wafer 12W are compressed against each other, at least some of the low-melting-point glass enters the communicating groove 112 to seal it (refer to FIGS. 3B and 3C). Thus, the cavities CT are formed that are either evacuated or filled with inert gas. After cooling the stacked wafers to room temperature, the low-melting-point glass LG solidifies and bonds together the lid wafer 11W and base wafer 12W.

In step S16, the bonded lid wafer 11W and base wafer 12W is cut into individual pieces. The quartz-crystal vibrating devices 100A are cut into individual pieces using a dicing unit such as laser beam or dicing saw. The cuts are made by cutting along predetermined scribe lines SL, denoted by dot-dash lines in FIGS. 5 and 6. In this first embodiment, the desired width of the laser or cutting blade is in the range of 50 to 200 µm. Thus, several hundreds to several thousands of quartz-crystal vibrating devices 100A according to the first embodiment are made.

Second Embodiment of Quartz-Crystal Vibrating Device

Figure 7:
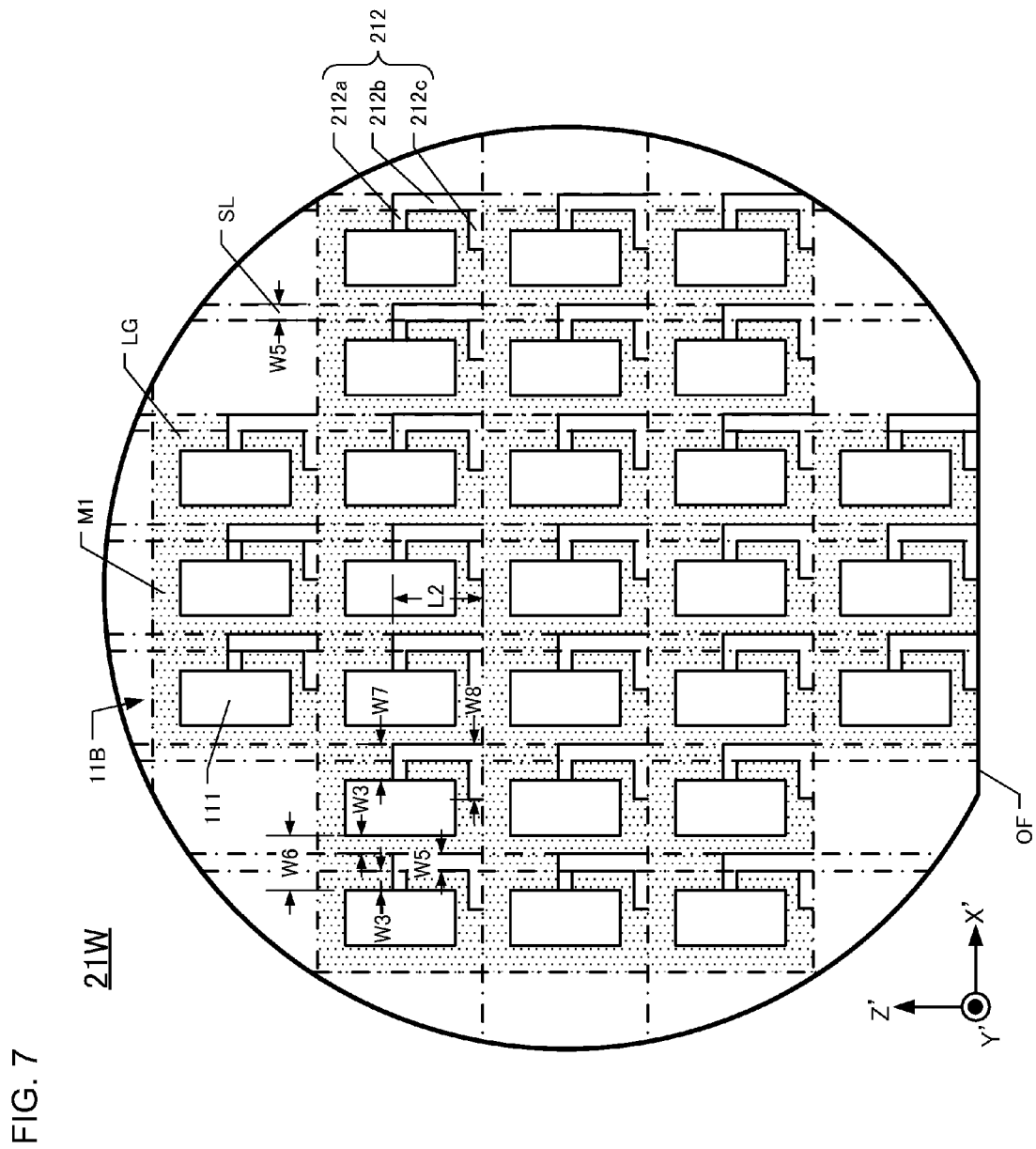
FIG. 7 is a plan view of a lid wafer of the second embodiment, before bonding.
Figure 8A:
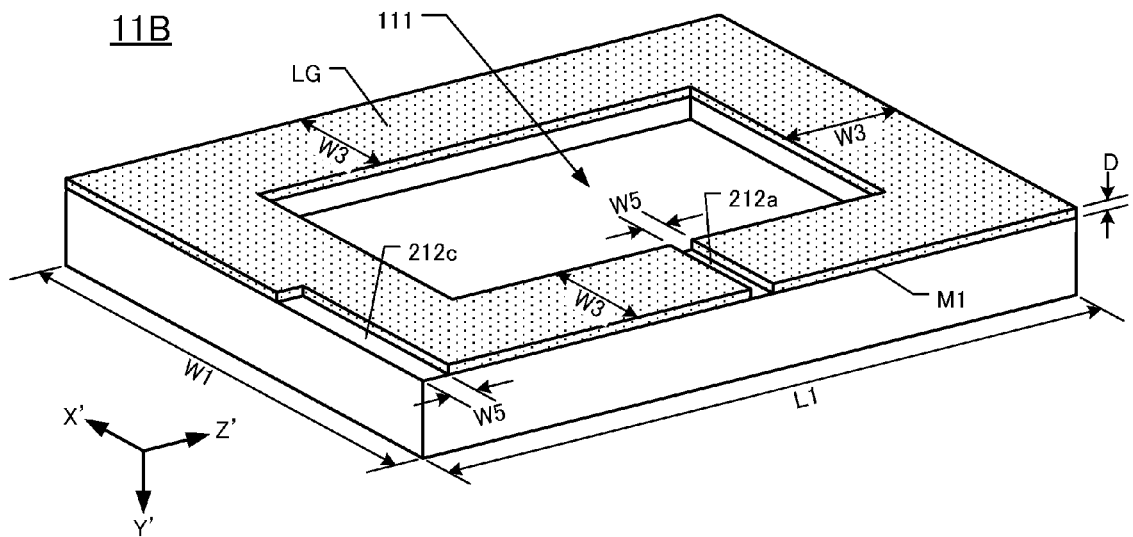
FIG. 8A is a perspective, upside-down view of a package lid of the second embodiment, after applying a sealing material.
Figure 8B:
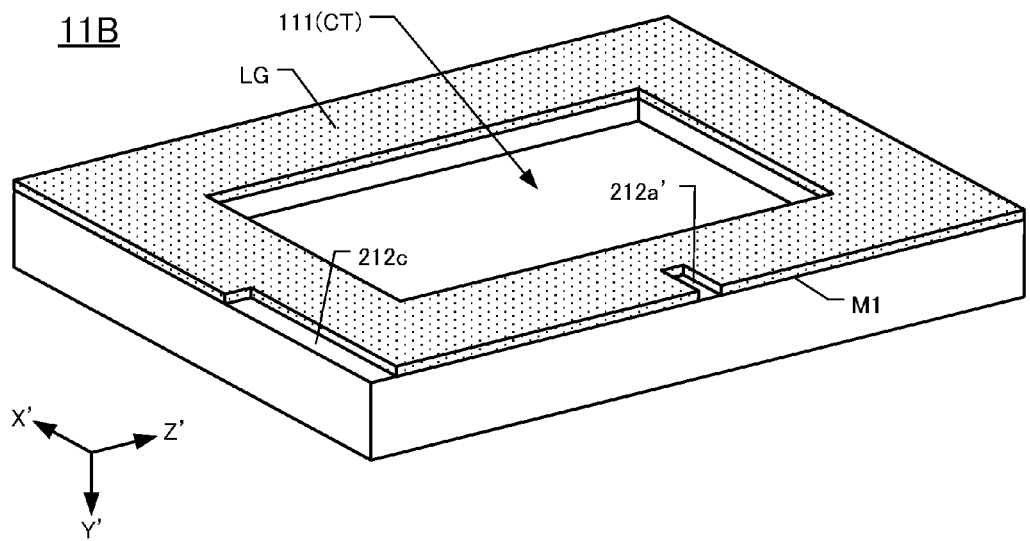
FIG. 8B is a perspective, upside-down view of a package lid of the second embodiment, showing a manner in which the communicating groove is filled at least partially by sealing material during bonding.

In the second embodiment, the package lid 11B comprises a communicating groove 212 having a different shape than the communicating groove 112 in the first embodiment. The following descriptions of the package lid 11B are made with reference to FIGS. 7 and 8. FIG. 7 is a plan view of the lid wafer 21W before bonding. FIG. 8A is an exploded perspective view of the package lid 11B before bonding, and FIG. 8B is an exploded perspective view of the package lid 11B after bonding. In this embodiment, components that are similar to corresponding components in the first embodiment have the same reference numerals.

Turning first to FIG. 7, the lid wafer 21W defines communicating grooves 212, each including a first groove portion 212a, a second groove portion 212b, and a third groove portion 212c located on the peripheral sealing surface M1 of the respective lid. One end of the first groove portion 212a extends in the X'-axis direction and opens in the respective lid recess 111, while the other end is connected to the second groove portion 212b, which extends in the Z'-axis direction. The third groove portion 212c extends in the X'-axis direction and is connected to the other end of the second groove portion 212b. The width W5 of the first groove portion 212a, the second groove portion 212b, and the third groove portion 212c is in the range of 10% to 30% of the width W3 of the peripheral sealing surface M1; i.e., W5=40 µm to 120 µm. In this second embodiment, details are described below with the width W5 assumed to be 100 µm, On the lid wafer 21W, the distance W6 between adjacent package lids 111 in the X'-axis directions is a sum: W6=2(W3)+W5.

The length W7 of the first groove portion 212a in the X'-axis direction is also a sum: W7=W3+W5, which is approximately 500 µm. Also, since the first groove portion 212a makes its connection substantially along the center-line of the package lid 111 in the Z'-axis direction, the length L2 of the second groove portion 212b in the Z'-axis direction is approximately 1,600 µm. The length W8 of the third groove portion 212c in the X'-axis direction is approximately 900 µm to 1,100 µm. Whenever the package lid 11B and package base 12A are stacked together, the third groove portion 212c extends toward the region of the base castellation 122a (FIG. 1). Therefore, whenever the lid wafer 21W and base wafer 12W (FIG. 6) are stacked together, the cavity CT is in communication with the external environment via the base through-hole BH1 (FIG. 6) and the communicating groove 212.

In this second embodiment, the width of the laser or blade used for cutting the bonded lid wafer 21W and base wafer 12W (FIG. 6) is approximately 100 µm. To prevent clogging of the dicing apparatus, it is preferred that the scribe lines SL (indicated by dot-dash lines) be formed along the second groove portion 212b of the communicating groove 212.

The package lid 11B before bonding is as indicated in FIG. 8A. This means that the second groove portion 212b is not disposed, and the first groove portion 212a, the second groove portion 212b, and the third groove portion 212c are formed on the peripheral sealing surface M1 of the package lid 11B extending in the X'-axis direction.

To seal the cavity CT hermetically after stacking the lid wafer 21W and base 12W, the first groove portion 212a connected to the cavity CT (lid recess 111 in FIG. 8) needs to be sealed, as shown in FIG. 8B. When the low-melting-point glass LG is heated and the lid wafer 11W and base wafer 12W are being compressed together, the low-melting-point glass LG surrounding the first groove portion 212a spreads and closes off the first groove portion 212a so as to seal it hermetically. In this case, even if the package base 12A and package lid 11A are bonded together, the groove portion 212a' remains, indicating the prior presence of the communicating groove 212 before the low-melting-point glass LG was compressed.

In the third groove portion 212c, which partially covers the base through-hole BH1, the low-melting-glass LG surrounding the third groove portion 212c will not likely compressed.

Manufacturing the Second Embodiment of a Quartz-Crystal Vibrating Device

The second embodiment of a quartz-crystal vibrating device is manufactured by a method that is substantially similar to the flow-chart of FIG. 4 depicting the method for manufacturing the first embodiment of a quartz-crystal vibrating device 100A. In step S15 pertaining to the separation of individual quartz-crystal vibrating pieces from one another, the lid wafer 21 is cut along the second groove portion 212b on the communicating groove 212 extending along the Z'-axis direction.

The following third to sixth embodiments have respective package lids having different communicating grooves. When discussing the package lid being compressed against the package base, the filling of the communicating groove with compressed low-melting-point glass is not described or shown in the respective drawings.

Third Embodiment of Crystal Vibrating Devices

Figure 9A:
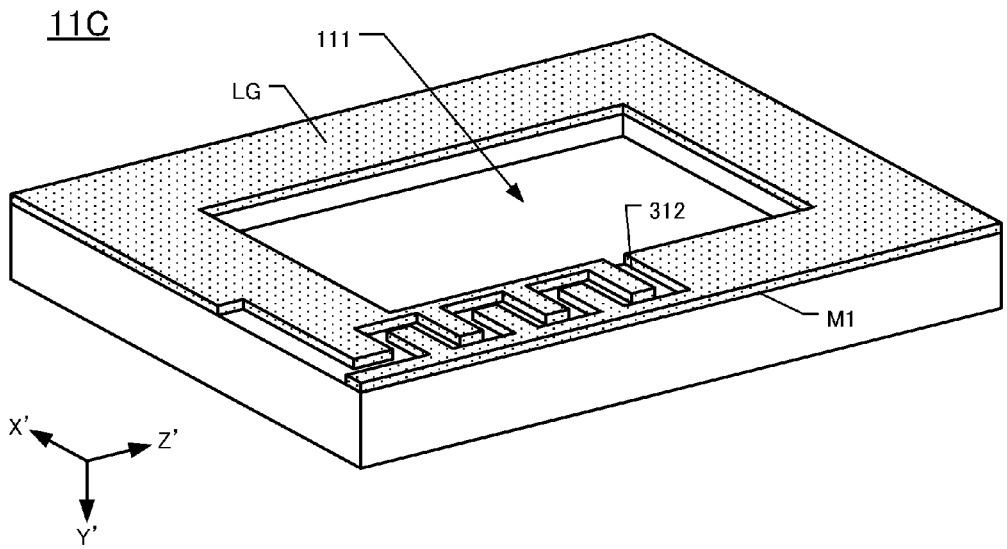
FIG. 9A is a perspective, upside-down view of a package lid of the third embodiment, after applying a sealing material.

FIG. 9A is a perspective view of a package lid 11C after forming the communicating groove 312 but before performing compression. On the peripheral sealing surface M1 of the package lid 11C, low-melting-point glass LG is applied as a sealing material. As applied, the low-melting-glass LG defines a communicating groove 312 used for temporarily communicating the lid recess 111 to the external environment. The communicating groove 312 has a serpentine pattern that provides multiple folds in the X'-axis direction.

When bonding the package lid 11C to the package base 12A the low-melting-point glass LG in the vicinity of the communicating groove 312 is squeezed so as to seal the communicating groove 312 hermetically. Since the total length of the communicating groove 312 is compressed into the serpentine pattern, and thus longer than in the first and second embodiments, the length over which the communicating groove 312 can be sealed is correspondingly extended. This allows, for example, the cavity CT to be sealed in a vacuum.

Fourth Embodiment of Crystal Vibrating Device

Figure 9B:
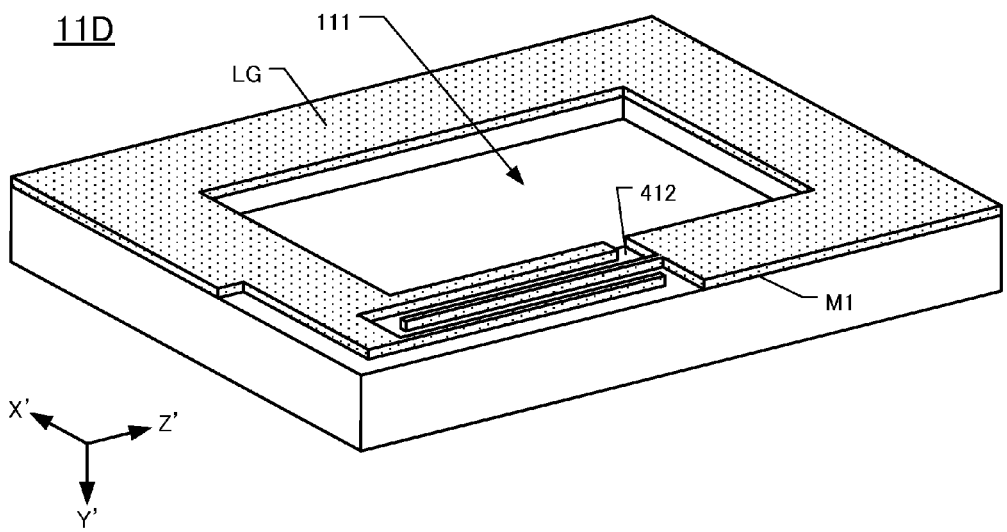
FIG. 9B is a perspective, upside-down view of a package lid of the fourth embodiment, after applying a sealing material.

FIG. 9B is a perspective view of the package lid 11D of the fourth embodiment before bonding but after forming the communicating groove 412.

The communicating groove 412, defined in the as-applied low-melting-glass LG, has a longitudinally extended zigzag pattern, in which the groove is folded multiple times in the Z'-axis direction. During bonding the package lid 11D and package base 12A together, compression causes the low-melting-point glass LG in the vicinity of the communicating groove 412 to be squeezed in a manner that closes off the communicating groove 412 and hermetically seals it. Since the length of the communicating groove 412 is extended compared to the first and second embodiments, the sealing area of the communicating groove 412 is correspondingly extended.

Fifth Embodiment of Crystal Vibrating Device

Figure 10A:
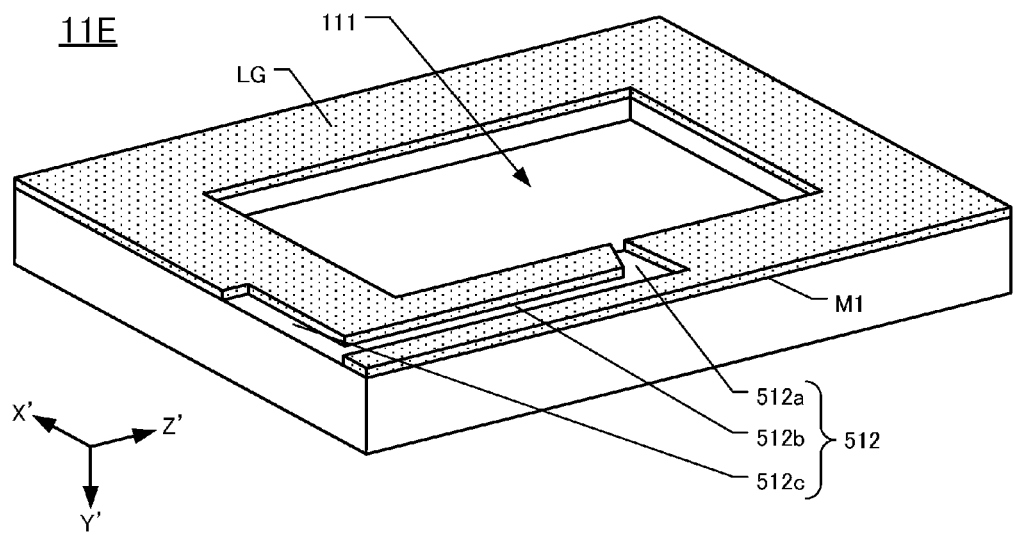
FIG. 10A is a perspective, upside-down view of a package lid of the fifth embodiment, after applying a sealing material.

FIG. 10A is a perspective view of the package lid 11E of the fifth embodiment after forming the communicating groove 512, but before bonding the package lid to the package base. On the peripheral sealing surface M1 of the package lid 11E, low-melting-glass LG is applied as a sealing material. The communicating groove 512 comprises a first groove portion 512a and a third groove portion 512c, both extending in the X'-axis direction, and a second groove portion 512b. The second groove portion 512b is connected to the first groove portion 512a and the third groove portion 512c and extends in the Z'-axis direction. The first groove portion 512a is configured to connect, while widening smoothly, from its opening into the lid recess 111 to the second groove portion 512b. The narrower opening of the first groove portion 512a into the lid recess 111 is approximately 50 μm, and the wider connection of the first groove portion 512a to the second groove portion 512b is approximately 200 μm. Thus, one end of the first groove portion 512a is connected to the lid recess 111. The third groove portion 512c connects the second groove portion 512b to the base through-hole BH1 (FIG. 6).

In the configuration shown in FIG. 10A, since the end of the first groove portion 512a opening into the lid recess 111 is narrower, this end of the communicating groove 512a can be easily sealed when the package lid 11E is being bonded to the package base 12A. Also, since the first groove portion 512a expands in width from the lid recess 111 outward in a substantially linear manner, pneumatic communication via the groove 512 is assured.

Sixth Embodiment of Crystal Vibrating Device

Figure 10B:
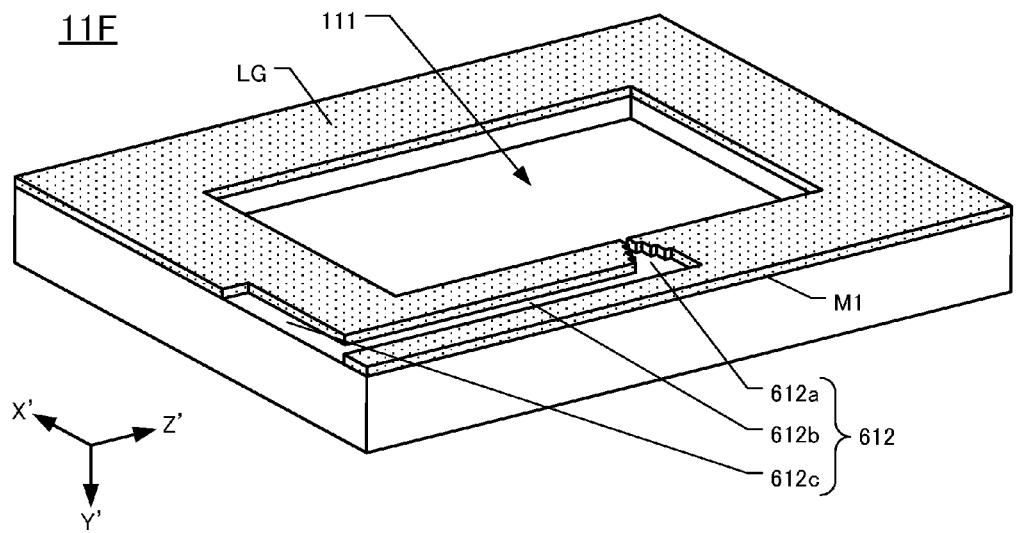
FIG. 10B is a perspective, upside-down view of a package lid of the sixth embodiment, after applying a sealing material.

FIG. 10B is a perspective view of the package lid 11F of the sixth embodiment after forming the communicating groove 512 but before bonding. On the peripheral sealing surface M1 of the package lid 11F, low-melting-point glass LG is applied as a sealing material. The communicating groove 612 comprises a first groove portion 612a and a third groove portion 612c, both extending in the X'-axis direction, and a second groove portion 612b. The second groove portion 612b extends in the Z'-axis direction. The first groove portion 612a is configured to connect, while widening in a stepwise manner, from its opening into the lid recess 111 to the second groove portion 612b. The narrower opening of the first groove portion 612aa into the lid recess 111 is approximately 50 μm, and the wider connection of the first groove portion 612a to the second groove portion 612b is approximately 200 μm.

Seventh Embodiment of Crystal Vibrating Device

Figure 11:
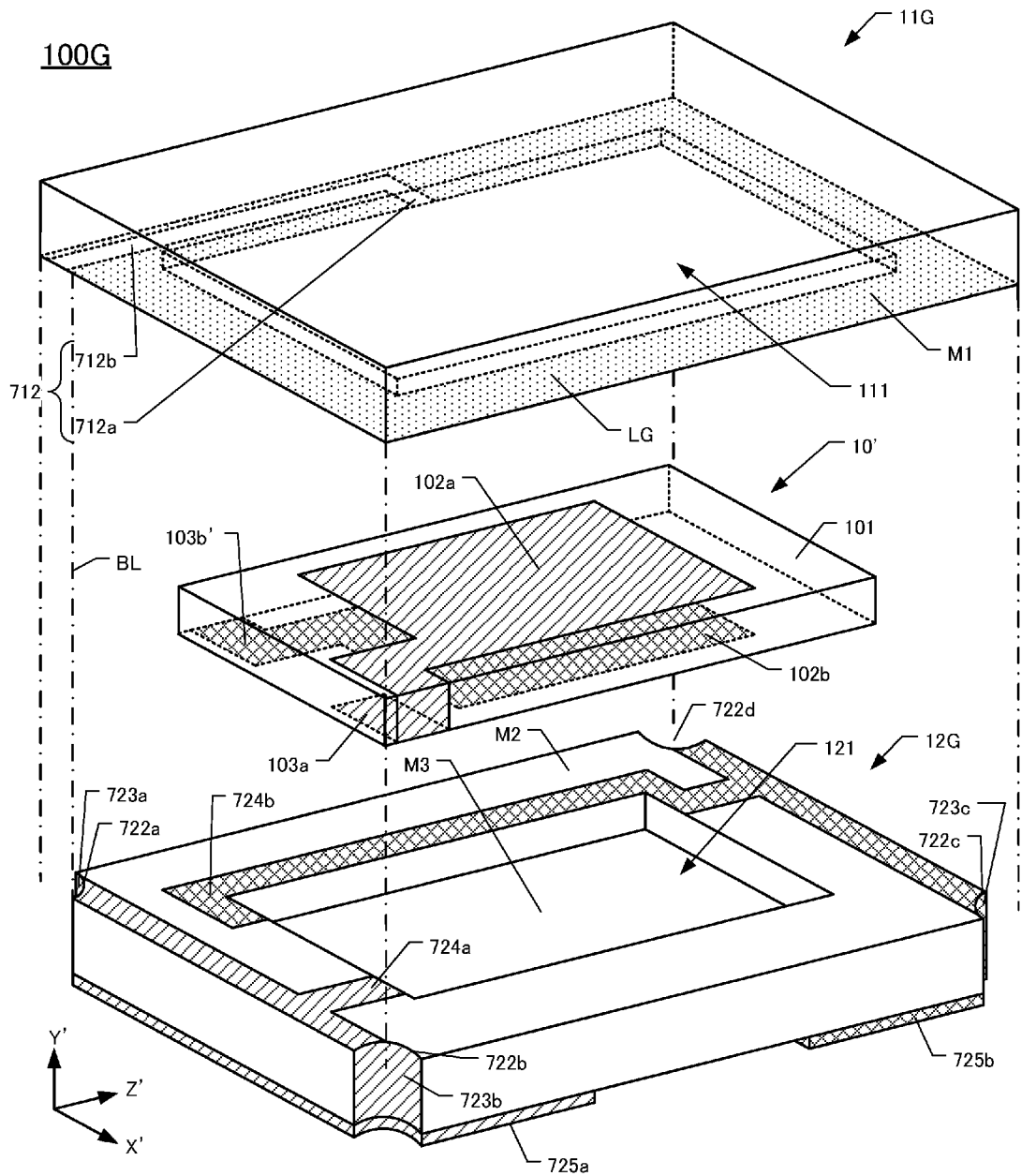
FIG. 11 is an exploded perspective view of a quartz-crystal vibrating device according to a seventh embodiment, before the package base and lid have been bonded together.

The configuration of the seventh embodiment of a quartz-crystal vibrating device 100G is described with references to FIGS. 11 and 12. FIG. 11 is an exploded perspective view of the embodiment 100G before being bonded together. FIG. 12A is a perspective view of the package lid 11G before it is bonded to the package base, and FIGS. 12B and 12C are upside-down perspective views of the package lid 11G in the seventh embodiment after the sealant has spread out by application of heat and pressure. In this embodiment, components that are similar to corresponding components in the first embodiment have the same reference numerals.

Turning first to FIG. 11, the seventh embodiment of a quartz-crystal vibrating device 100G comprises a package lid 11G defining a lid recess 111, a package base 12G defining a base recess 121, and a quartz-crystal vibrating piece 10' mounted inside the base recess 121. Extraction electrodes 103a and 103b' are formed on the −Y' surface of the quartz-crystal vibrating piece 10'. The quartz-crystal vibrating piece 10' is bonded to the package base 12G, which is fabricated of a material such as a piezoelectric material (e.g., quartz-crystal) or glass, using an electrically conductive adhesive 13. Each of the four corners of the package base includes a respective base castellation 722a-722d. On the lower main surface (i.e., the mounting surface of the quartz-crystal vibrating device) of the package base 12G are a pair of excitation electrodes 725a, 725b formed on both Z'-axis edges of the device. Opposing corners of the package base 12G include respective base castellations 722a, 722b, on which respective base edge-surface electrodes 723a, 723b are formed. One end of each edge-surface electrode is connected to a respective external electrode 725a. The other two opposing corners of the package base also include respective base castellations 722c, 722d. Each of these base castellations 722c, 722d includes a respective edge-surface electrode 723c, 723d that is connected to a respective external electrode 725a, 725b. On the peripheral sealing surface M2 of the package base 12G are connecting electrodes 724a, 724b, which are connected to the other ends of the respective base edge-surface electrodes 723a-723d.

The connecting electrode 724b is situated on the peripheral sealing surface M2 of the package base 121 just outboard of the base recess 121. The connecting electrode 724b extends on the peripheral sealing surface M2 in the −Z'-axis direction to the same side of the peripheral sealing surface M2 as the connecting electrode 724a. Alternatively, the connecting electrode 724b can extend (in the −Z'-axis direction) across the bottom surface M3 of the package base 121 to the same side of the peripheral sealing surface M2 on which the connecting electrode 724a is located.

Similar to the first embodiment, when mounting the quartz-crystal vibrating piece 10' onto the peripheral sealing surface M2 of the package base, the excitation electrodes 102a, 102b on the quartz-crystal vibrating piece 10' are connected to the respective connecting electrodes 724a, 724b on the package base 12G. Hence, whenever an alternating voltage (voltage that alternates between the positive and negative of a particular value) is applied across the external electrodes 125a, 125b, the quartz-crystal vibrating device 10' exhibits thickness-shear vibration.

The package lid 11G is described with reference to FIGS. 12A-12C. In these figures, the lid recess 111 is drawn facing upward to provide a better understanding. As shown in FIG. 12A, the package lid 11G comprises a peripheral sealing surface M1 that surrounds the lid recess 111. The peripheral sealing surface M1 is bonded to the peripheral sealing surface M2 of the package base 12G.

Low-melting-point glass LG is applied to the peripheral sealing surface M1 of the package lid 11G in a manner that forms a communicating groove 712. The communicating groove 712 includes a first groove portion 712a and a second groove portion 712b. One end of the first groove portion 712a extends in the X'-axis direction to the lid recess 111, while the other end is connected to the second groove portion 712b. The second groove portion 712b extends in the Z'-axis direction. Here, the dimensions of the first groove portion 712a and the second groove portion 712b are as described for the respective first groove portion 112a and second groove portion 112b in the first embodiment. Whenever the package lid 11G and package base 12G are bonded together, the second groove portion 712b extends to the base castellation 722a (see base line BL in FIG. 11).

Whenever the package lid 11G and package base 12G are stacked together for bonding, the cavity CT is connected temporarily to the external environment via the base castellation 722a and the communicating groove 712. This temporary communication is sufficient to achieve the desired gaseous exchange. After the cavity has been appropriately ventilated (with an inert gas or evacuated), the communicating groove 712 is hermetically sealed as the cavity CT itself is sealed hermetically. During bonding, application of heat and pressure to the package lid 11G and package base 12G squeezes the low-melting-point glass LG in the vicinity of the communicating groove 712, which compresses it and seals the communicating groove 712 with the low-melting-point glass.

FIG. 12B shows a situation, after compression, in which some of the low-melting-point glass LG in the vicinity of the second groove portion 712b has been squeezed. Even after bonding this package lid 11G and package base 12G together, the first groove portion 712a and a part of the second groove portion 712b remain open to the cavity CT, while another part of the second groove portion 712b remains open to the base castellation 722a. These vestigial openings indicate the residual existence of the communicating groove 712 before the low-melting-point glass LG had been compressed.

In FIG. 12C, some of the low-melting-point glass LG surrounding the first groove unit 712a has been compressed, thereby sealing the communicating groove 712. Even after bonding this package lid 11G to the package base 12G, the groove portion 712' remains, indicating the residual presence of the communicating groove 712 before compression of the low-melting-point glass LG. Although not indicated in the drawings, two areas of low-melting-point glass LG indicated in FIGS. 12B and 12C may be compressed at the same time. Also, the entire first groove portion 712a and second groove portion 712b may be compressed.

Figure 13:
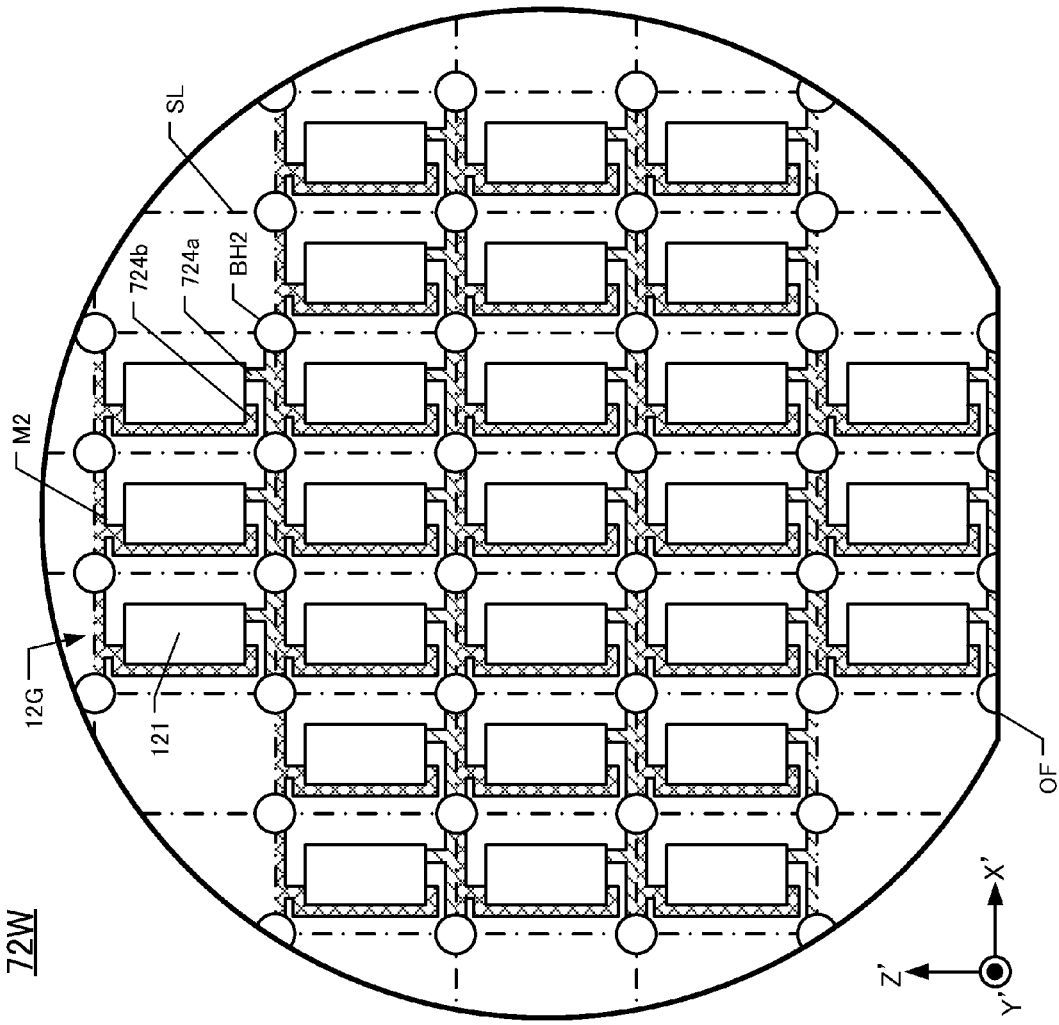
FIG. 13 is a plan view of a base wafer as used in the seventh embodiment.

The seventh embodiment of a quartz-crystal vibrating device can be manufactured by a method depicted by a flow-chart that is substantially similar to the flow-chart of FIG. 4. However, during manufacture of the seventh embodiment, the shape of the extraction electrode 103b' on the quartz-crystal vibrating piece 10' in the protocol S10 is different. Also, the shape of the communicating groove formed in the low-melting-point glass LG in step S112 is different. Also, the protocol S12 for manufacturing the package base 12G is different from the first embodiment. In the following description, the protocol S12 for manufacturing the base wafer 72W is explained with reference to FIG. 13. FIG. 13 is a plan view of the base wafer in the seventh embodiment.

In step S121, as shown in FIG. 13, the base recesses 121 are formed on the base wafer. At the same time, respective base through-holes BH2 are formed on the four corners of the package base 12G. Each through-hole BH2 is a circular cut-hole that extends through the base wafer 72W depthwise. When the bonded wafer is being cut along cut lines, these round through-holes BH2 are become four respective quarter-round sections, which become the castellations 722a-722d (see FIG. 11).

In step S122, the external electrodes 725a, 725b (FIG. 11) are formed on the lower main surface of the base wafer 72W, as indicated in FIG. 13. Also, in the base through-holes BH2 are formed respective base edge-surface electrodes 723a, 723b, which are connected to the respective external electrode 725a. Also formed are the base edge-surface electrodes 723c, 723d, which are connected to the external electrode 725b, (FIG. 11). On the peripheral sealing surface M2 are formed the connecting electrode 724a (connected to the base edge-surface electrodes 723a, 723b) and the connecting electrode 724b (connected to the base edge-surface electrodes 723c, 723d.

Eighth Embodiment of Crystal Vibrating Device

Figure 14:
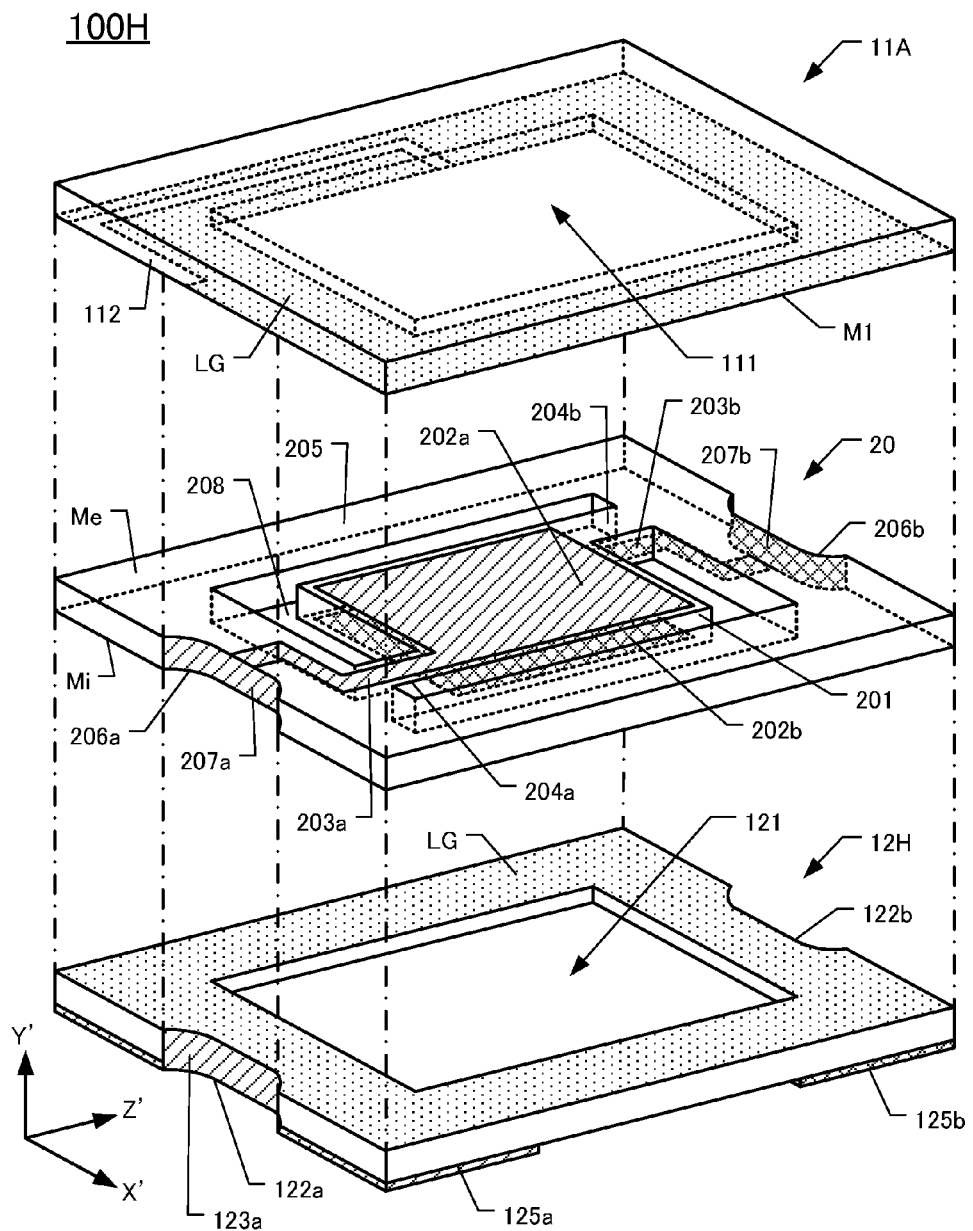
FIG. 14 is an exploded perspective view of a quartz-crystal vibrating device according to the eighth embodiment, before the package base and lid have been bonded together.

The general configuration of this embodiment of a quartz-crystal vibrating device 100H is described with reference to FIG. 14. FIG. 14 is an exploded perspective view of the eighth embodiment 100H before bonding the pieces together. In this embodiment, components that are similar to corresponding components in the first embodiment have the same reference numerals.

As shown in FIG. 14, the vibrating device 100H comprises a quartz-crystal frame 20 that is sandwiched between the package lid 11A and the package base 12H. When the package lid 11A and the package base 12H are bonded to respective peripheral sealing surfaces of the quartz-crystal frame 20, the package base 12H and the quartz-crystal frame 20 form a cavity CT (FIG. 2). In the eighth embodiment, the package lid 11A is bonded to the quartz-crystal frame 20 using low-melting-point glass LG, and the package base 12H is bonded to the quartz-crystal frame 20 using low-melting-point glass LG.

In this embodiment the connecting electrodes 124a, 124b (FIG. 1) are not formed on the package base 12H, which is different from the package base 12A used in the first embodiment.

Figure 15:
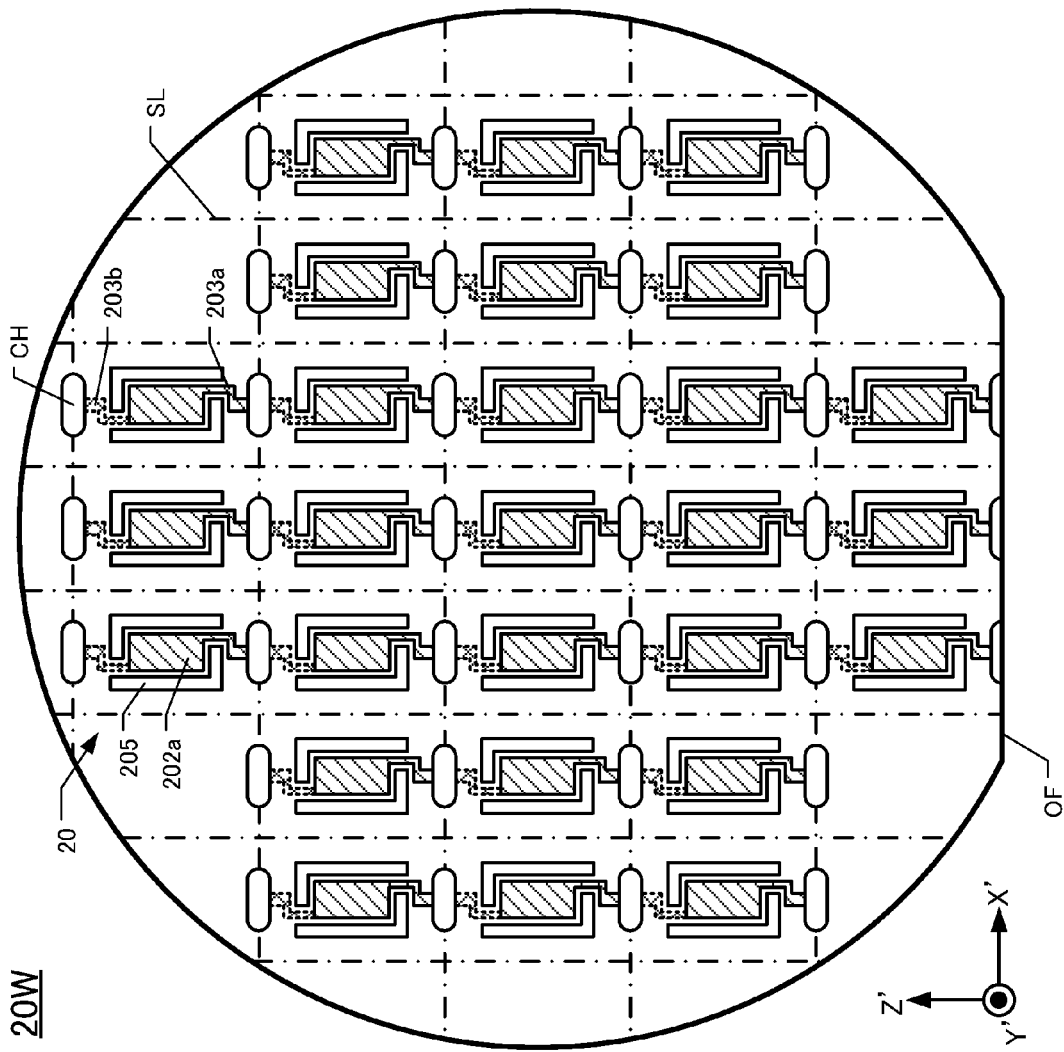
FIG. 15 is a plan view of a quartz-crystal wafer as used in the eighth embodiment.

The quartz-crystal frame 20 is fabricated from an AT-cut quartz-crystal material having an upper main surface Me facing the package lid 11H and a lower main surface Mi facing the package base 12H. The quartz-crystal frame 20 comprises a vibrating portion 201 (including the excitation electrodes 202a, 202b) and an outer frame 205 that surrounds the vibrating portion 201. Also, a respective joining portion 204a and 204b extends between an edge of the vibrating portion 201 and the outer frame 205. The joining portions 204a, 204b extend from the vibrating portion 201 to each edge of the outer frame 205 in the Z'-axis directions. This leaves two L-shaped voids 208 situated between the vibrating portion 201 and the outer frame 205. On both edges of the quartz-crystal frame 20 in the Z'-axis directions, respective castellations 206a, 206b are formed. These castellations were originally formed as rounded-rectangular quartz-crystal through-holes CH (FIG. 15). On each castellation 206a, 206b is a respective side-surface electrode 207a, 207b.

On the upper main surface Me of the joining portion 204a, an extraction electrode 203a is formed. The extraction electrode connects from the respective excitation electrode 202a to the respective edge-surface electrode 207a on the respective castellation 206a. On the lower main surface Mi of the joining portion 204b, an extraction electrode 203b is formed. The extraction electrode 203b connects from the respective excitation electrode 202b to the respective edge-surface electrode 207b on the respective castellation 206b.

When the stacked upper main surface Me on the crystal frame 20 is bonded to the package lid 11A, and the lower main surface Mi on the crystal frame 20 is bonded to the package base 20H, the communicating groove 112 extends to the quartz-crystal castellation 206a. Hence, when the package lid 11A is stacked onto the quartz-crystal frame 20 for bonding, the cavity CT is in temporary pneumatic communication with the external environment via the base castellation 122a, the quartz-crystal castellation 206a, and the communicating groove 112.

During bonding, but after ventilating the cavity, the applied low-melting-point glass LG is heated while the package lid 11A and quartz-crystal frame 20 are being compressed together, which bonds the quartz-crystal frame 20 and package lid 11A together. During compression of the low-melting-point glass LG in the vicinity of the communicating groove 112, the communicating groove 112 becomes hermetically sealed after having been evacuated or filled with an inert gas as specified during the previous gaseous exchange.

The excitation electrodes 202a, 202b are connected to respective external electrodes 125a, 125b (formed on the lower main surface (mounting surface) of the vibrating device 100H) via respective extraction electrodes 203a, 203b, edge-surface electrodes 207a, 207b, and base edge-surface electrodes 123a, 123b.

In this eighth embodiment, after the package base 12H and the quartz-crystal frame 20 have been bonded together using the low-melting-point glass LG, the package lid 11A is bonded to the quartz-crystal frame 20. Alternatively, the package base 12H, the quartz-crystal frame 20, and the package lid 11A can be bonded together at the same time. Although low-melting-point glass LG was applied on the package lid 11A, the low-melting-point glass alternatively can be formed on the peripheral sealing surface Me of the quartz-crystal frame 20.

In this embodiment, although the package base 12H and the quartz-crystal frame 20 are bonded together using the low-melting-point glass LG, the package base 12H and quartz-crystal frame 20 can alternatively be bonded together by siloxane bonding or by anodic bonding, instead of using low-melting-point glass LG.

During manufacture of the eighth embodiment 100H, the package lid 11A is manufactured by the following protocol S11 described in the first embodiment. The package base 12H is manufactured according to the protocol S12 described in the first embodiment. However, this embodiment still includes the steps of forming each electrode, forming the pair of external electrodes 125a, 125b, and forming the base edge-surface electrodes 123a, 123b.

The method for manufacturing the quartz-crystal frame 20 is described using FIG. 15 as a reference. FIG. 15 is a plan view of the quartz-crystal wafer 20W of this embodiment. First, a profile outline of the quartz-crystal frame 20 is formed on a planar quartz-crystal wafer 20W by etching. During this step the quartz-crystal vibrating portion 201, the outer frame 205, and the pair of voids 208 are formed, and the rounded, rectangular through-holes CH are formed on each quartz-crystal frame 20 in the Z'-axis directions. Each half of a quartz-crystal through-hole CH forms a respective castellation 206a, 206b (FIG. 14).

On both surfaces of the quartz-crystal wafer 20W and on the surface of the through-holes CH, a foundation layer of chromium (Cr) is formed, followed by an overlying layer of gold (Au), are formed by sputtering or vacuum-deposition.

Then, a photoresist is applied uniformly on the entire surface of the metal film. Using an exposure tool (not shown), the outline pattern of the excitation electrodes 202a, 202b, the extraction electrodes 203a, 203b, and the quartz-crystal side-surface electrodes 207a, 207b are exposed onto the quartz-crystal wafer 20W. Afterward, regions of the metal layer denuded by the photoresist are etched. As shown in FIG. 14, the excitation electrodes 202a, 202b and the extraction electrodes 203a, 203b are formed on the quartz-crystal wafer 20W, and the edge-surface electrodes 207a, 207b are formed on the inside surfaces of the through-holes CH.

INDUSTRIAL APPLICABILITY

Representative embodiments have been described in detail above. As evident to those skilled in the art, the present invention may be changed or modified in various ways within the technical scope of the invention. For example, as an alternative to AT-cut quartz-crystal vibrating pieces, the present invention may be directed to the manufacture of tuning-fork type vibrating pieces. In this specification, although the various embodiments have been described in the context of quartz-crystal vibrating pieces, it will be understood that the embodiments can be applied with equal facility to piezoelectric materials such as lithium tantalite and lithium niobate. Furthermore, the present disclosure can be applied to piezoelectric oscillators that also include an IC configured as an oscillating circuit mounted inside the package on the package base.

What is claimed is:

1. A method for manufacturing a piezoelectric device, comprising:

preparing a base wafer including multiple package bases each having a first main surface including respective external electrodes and a second main surface opposite the first main surface, the second main surface including a respective peripheral sealing surface, the base wafer also defining at least a pair of respective through-holes located between adjacent package bases wherein each said respective through-hole extends from the first main surface to the second main surface, each said package base, when assembled with a package lid, forms a respective package defining an interior cavity;

attaching a respective piezoelectric vibrating piece to each said package base, each said respective piezoelectric vibrating piece including a respective pair of excitation electrodes;

preparing a lid wafer including multiple package lids, each said package lid having a first main surface and a second main surface opposite the first main surface, the second main surface of said package lid including a respective peripheral sealing surface;

applying a sealing material onto the peripheral sealing surfaces of the package bases or onto the peripheral sealing surfaces of the package lids, the sealing material being applied as a continuous circumferential band having a predetermined width and including a communicating groove allowing temporary pneumatic communication to and from the interior cavity via the through-hole; and in a vacuum or inert-gas atmosphere, allowing gaseous exchange to and from the interior cavities via the respective communicating grooves and through-holes while applying heat and compression, the heat and compression bonding the base and lid wafers together while allowing flow of the sealing material into at least a portion of the communicating grooves sufficient to seal the interior cavities after the gaseous exchange.

2. The method of claim 1, further comprising forming a metal film on respective interior surfaces of the through-holes, the metal film connecting together each said excitation electrode with a respective external electrode.

3. The method of claim 1, wherein the sealing material is an adhesive comprising a glass that melts between 350° C. to 410° C.

4. The method of claim 1, further comprising, after bonding the lid and base wafers together, cutting the bonded lid and base wafers along pre-established scribe lines to release individual piezoelectric vibrating devices, the scribe lines being located so as to allow cutting across respective communicating grooves.

5. The method of claim 4, wherein the communicating grooves expand in width from the respective interior cavities to the scribe lines.

6. The method of claim 1, further comprising, after bonding the lid and base wafers together, cutting the bonded lid and base wafers along pre-established scribe lines to release individual piezoelectric vibrating devices, the communicating grooves being located so as to extend from the scribe lines to the respective interior cavities.

7. The method of claim 6, wherein the communicating grooves increase in width from the respective interior cavities to the scribe lines.

8. The method of claim 1, wherein each said communicating groove has at least a portion having a width that is in a range of 10% to 30% of the width of the continuous circumferential band of sealing material.

9. The method of claim 1, wherein:
the package base has a rectangular plan profile;
a respective through-hole is located on each corner of the rectangular profile;
the interior cavity has a rectangular shape with opposing short sides and opposing long sides; and
each said communicating groove extends from a respective long side of the rectangular cavity to the respective through-hole at each said corner of the rectangular profile.

10. The method of claim 1, wherein:
the package base has a rectangular plan profile with opposing short sides and opposing long sides;
a respective through-hole is located between adjacent short sides: the interior cavity has a rectangular shape; and
each said communicating groove extends from a respective long side of the rectangular cavity to the respective through-hole located between adjacent said short sides.

11. A method for manufacturing a piezoelectric device, comprising:

preparing a base wafer including multiple package bases each having a first main surface including respective external electrodes and a second main surface opposite the first main surface, the second main surface including a respective peripheral sealing surface, the base wafer also defining at least a pair of first respective through-holes located between adjacent package bases, wherein each said first respective through-hole extends from the first main surface to the second main surface, each said package base, when assembled with a piezoelectric frame and package lid, forms a respective package defining an interior cavity;

preparing a piezoelectric wafer including multiple piezoelectric frames, each said piezoelectric frame including a respective piezoelectric vibrating piece attached to and surrounded by an outer frame, each said respective piezoelectric vibrating piece having respective excitation electrodes, a first peripheral sealing surface, and a second peripheral sealing surface, the piezoelectric wafer defining at least a pair of respective second through-holes located between adjacent said outer frames, wherein each said second through-hole extends from the first peripheral sealing surface to the second peripheral sealing surface;

preparing a lid wafer including multiple package lids each having an outer main surface and an inner main surface, the inner main surface including a peripheral sealing surface;

applying a sealing material on at least one of the peripheral sealing surface of the inner main surface of each said package lid and the first peripheral sealing surface of each outer frame, and on at least one of the second peripheral sealing surface of each said outer frame and the respective peripheral sealing surface of the second main surface of each said package base, the sealing material being applied as a continuous band having a predetermined width and including a communicating groove allowing temporary pneumatic communication to and from the interior cavity via the first through-holes or second through-holes; and in a vacuum or inert-gas atmosphere, allowing gaseous exchange to and from the interior cavities via the communicating groove and said first and second respective through-holes while applying heat and compression, the heat and compression bonding the lid and base wafers together while allowing flow of said sealing material into at least a portion of the communicating grooves sufficient to seal the interior cavities after the gaseous exchange.

* * * * *